United States Patent
Fujisawa

(10) Patent No.: US 8,193,024 B2
(45) Date of Patent: Jun. 5, 2012

(54) MANUFACTURING METHOD FOR SEMICONDUCTOR DEVICES AND SEMICONDUCTOR DEVICE

(75) Inventor: Atsushi Fujisawa, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 282 days.

(21) Appl. No.: 12/647,444

(22) Filed: Dec. 26, 2009

(65) Prior Publication Data

US 2010/0164082 A1 Jul. 1, 2010

(30) Foreign Application Priority Data

Dec. 26, 2008 (JP) .................................. 2008-332637

(51) Int. Cl.
*H01L 21/00* (2006.01)
*H01L 21/44* (2006.01)

(52) U.S. Cl. .......... 438/64; 438/112; 438/124; 438/617; 257/E21.502

(58) Field of Classification Search .................. 438/112, 438/124, 617, 64; 257/E21.502
See application file for complete search history.

(56) References Cited

U.S. PATENT DOCUMENTS

| 6,120,301 | A * | 9/2000 | Ichitani et al. .............. | 438/112 |
| 7,563,644 | B2 * | 7/2009 | Minamio et al. ............. | 438/116 |
| 2001/0006259 | A1 * | 7/2001 | Muto et al. .................. | 257/787 |
| 2002/0096791 | A1 * | 7/2002 | Muto et al. .................. | 257/787 |
| 2007/0148822 | A1 * | 6/2007 | Haba et al. .................. | 438/110 |
| 2009/0046183 | A1 | 2/2009 | Nishida et al. | |
| 2009/0050994 | A1 * | 2/2009 | Ishihara et al. ............. | 257/432 |
| 2009/0053850 | A1 * | 2/2009 | Nishida et al. ............... | 438/64 |
| 2009/0243015 | A1 * | 10/2009 | Yoneda et al. ............... | 257/434 |

FOREIGN PATENT DOCUMENTS

| JP | 04-313036 A | 11/1992 |
| JP | 2003-154551 A | 5/2003 |
| JP | 2003-161721 A | 6/2003 |
| JP | 2006-303481 A | 11/2006 |

* cited by examiner

*Primary Examiner* — Nitin Parekh

(74) *Attorney, Agent, or Firm* — Miles & Stockbridge P.C.

(57) ABSTRACT

The reliability of a photosensor-type semiconductor device is enhanced. The sealing step in a manufacturing process for the semiconductor device is carried out as described below. A molding die having an upper die and a lower die is prepared and a film is arranged between the upper die and the lower die. A lead frame in which first adhesive, a semiconductor chip, second adhesive 11, and a base material are mounted over the upper surface of each tab is arranged between the film and the lower die. The base material has an opening formed therein and the opening is covered with a protective sheet. The semiconductor chip has a light receiving area formed in its main surface. The upper die and the lower die are clamped to cause part of the base material to bite into the film. Thereafter, sealing resin is supplied to between the film and the lower die to form a blanket sealing body. Thus the photosensor-type semiconductor device without resin flash over the light receiving area is obtained.

11 Claims, 31 Drawing Sheets

MANUFACTURING METHOD FOR SEMICONDUCTOR DEVICES AND SEMICONDUCTOR DEVICE

CROSS-REFERENCE TO RELATED APPLICATIONS

The disclosure of Japanese Patent Application No. 2008-332637 filed on Dec. 26, 2008 including the specification, drawings and abstract is incorporated herein by reference in its entirety.

BACKGROUND OF THE INVENTION

The present invention relates to semiconductor devices and manufacturing technologies therefor and in particular to a technology effectively applicable to a photosensor-type semiconductor device having a semiconductor chip with a photosensor formed in the main surface thereof.

In recent years, photosensor-type semiconductor devices are widely used in solid-state image pickup devices, optical pickup devices, and the like. An example of the manufacturing methods for photosensor-type semiconductor devices is disclosed in Japanese Unexamined Patent Publication No. 2006-303481 (Patent Document 1). This manufacturing method is for a solid-state image pickup device comprised of: a sensor package bonded over a wiring board; multiple bonding wires coupling the wiring board and the sensor package together; and sealing resin sealing the periphery of the cover glass of the sensor package; and an external conductor pad formed in the under surface of the wiring board.

For example, Japanese Unexamined Patent Publication No. 2003-161721 (Patent Document 2), Japanese Unexamined Patent Publication No. 2003-154551 (Patent Document 3), and Japanese Unexamined Patent Publication No. Hei 4 (1992)-313036 (Patent Document 4) disclose other semiconductor devices. Though they are not photosensors, these semiconductor devices are so structured that part of a semiconductor element with a sensor formed therein is exposed from encapsulation resin.

[Patent Document 1]
Japanese Unexamined Patent Publication No. 2006-303481
[Patent Document 2]
Japanese Unexamined Patent Publication No. 2003-161721
[Patent Document 3]
Japanese Unexamined Patent Publication No. 2003-154551
[Patent Document 4]
Japanese Unexamined Patent Publication No. Hei 4 (1992)-313036

SUMMARY OF THE INVENTION

In photosensor-type semiconductor devices, a circuit is operated by applying light to the sensor surface of a mounted semiconductor chip. For this reason, it is required to ensure a light passage for the sensor surface of the semiconductor chip.

In recent years, meanwhile, there is a demand for reduction of the manufacturing costs of semiconductor devices. From the viewpoint of cost reduction, a means for mounting a semiconductor chip over a lead frame and coupling leads and the semiconductor chip together through wires is effective. Also when a semiconductor chip is mounted over a wiring substrate, a means for coupling the semiconductor chip and the wiring substrate together through wires is effective. When a semiconductor chip is coupled with leads or a wiring substrate through wires, it is required to protect the wires and the semiconductor chip. One of protecting means is a method of sealing the wires and the semiconductor chip with resin.

However, when the sensor surface of a semiconductor chip is sealed with resin, light is intercepted. To cope with this, the sensor surface of the semiconductor chip must be exposed. With the sensor surface exposed, however, there is concern that a contamination may stick to the sensor surface during a manufacturing process. The sensor surface may be damaged by this contamination. A contamination sticking to a sensor surface and a flaw in a sensor surface contribute to degradation in the reliability of the photosensor and thus it is required to prevent the adhesion of a contamination.

As a method for protecting a sensor surface, for example, the method described in Patent Document 1 has been considered. In this method, a glass material (cover glass) is bonded over a sensor surface to protect the sensor surface. When a glass material is arranged over a sensor surface, however, transmitted light undergoes attenuation, refraction, or the like due to the presence of the cover glass and there is a possibility that the detection efficiency, sensitivity, and the like of the photosensor will be degraded. A cover glass made of a material less in light attenuation could be selected. However, this poses new problems of difficulty in processing cover glass and the expensiveness of component materials.

When resin sealing is conducted with cover glass arranged over the sensor surface of a semiconductor chip, there is a possibility that a contamination, such as resin flash, will stick to the surface of the glass material during resin sealing and this makes quality stabilization difficult.

For example, Patent Documents 2, 3, 4 disclose a method in which the sensor surface of a semiconductor chip is exposed by abutting part of a sealing mold against the sensor surface and sealing the chip with the sensor surface covered. However, when this method is applied to a photosensor-type semiconductor device, the mold is brought into contact with the sensor surface (light receiving surface) of the semiconductor device and stress is applied thereto during resin sealing. Therefore, there is a possibility that a light receiving element or the like will be damaged and this makes it impossible to sufficiently ensure stable product performance (non-defectives).

If processing is carried out with a sensor surface exposed, a risk of a contamination sticking over the sensor surface or a chemical substance sticking to the sensor surface during a manufacturing process is increased. For example, in the above method in which a sealing mold is abutted against a sensor surface to expose the sensor surface, resin flash is formed between the mold and the sensor surface. This becomes a contamination and contributes to degradation in the reliability of the obtained photosensor.

The present inventors also investigated a method in which a photosensor is manufactured with its sensor surface kept covered with a protective sheet during a manufacturing process and the protective sheet is stripped after finish. However, it was revealed that it was difficult to completely eliminate a gap at an end of a protective sheet in a method of just arranging the protective sheet over a sensor surface. For this reason, resin flash is produced at the above end even though encapsulation resin is injected with a sealing mold and a protective sheet abutted against each other. (Resin flash refers to resin protrusions formed by encapsulation resin entering through a very narrow gap between a protective sheet and a sealing mold and going toward the surface of the protective sheet.)

In this case, the resin flash drops at a step of stripping the protective sheet and sticks to the sensor surface. This degrades the reliability of the semiconductor device as a photosensor. Or, a new step of removing the resin flash that dropped off is required.

As mentioned above, the following method is effective from the viewpoint of reducing the manufacturing cost of a photosensor-type semiconductor device: a method in which a semiconductor chip is mounted over a lead frame, leads and the semiconductor chip are coupled together through wires, and the semiconductor chip and the wires are sealed with resin. However, when this method is applied to a photosensor-type semiconductor device, it is required to take the following measure from the viewpoint of reliability securement: a passage for applying light to a sensor surface is ensured and at the same time the sensor surface is protected against damage and the adhesion of a contamination.

The invention has been made with the above-mentioned problems taken into account and it is an object of the invention to provide a technology that makes it possible to enhance the reliability of a photosensor-type semiconductor device.

The above and other objects and novel features of the invention will be apparent from the description in this specification and the accompanying drawings.

The following is a brief description of the gist of the representative elements of the invention laid open in this application:

The manufacturing method for semiconductor devices in one embodiment of the invention comprises the step of: (a) preparing a first base material having a chip mounting area and multiple electrode areas arranged around the chip mounting area; (b) mounting a semiconductor chip having a first main surface, a sensor area formed in the first main surface, multiple pads formed in the first main surface and electrically coupled with the sensor area, a first back surface on the opposite side to the first main surface, and first side surfaces positioned between the first main surface and the first back surface over the chip mounting area through first adhesive so that the first back surface is opposed to the chip mounting area; (c) mounting a second base material having a second main surface, a second back surface on the opposite side to the second main surface, second side surfaces positioned between the second main surface and the second back surface, and an opening extended from the second main surface to the second back surface, the opening being covered with a protective sheet stuck over the second main surface, over the first main surface of the semiconductor chip through second adhesive so that the second back surface is opposed to the first main surface of the semiconductor chip; (d) respectively electrically coupling the pads of the semiconductor chip and the electrode areas together through multiple conductive members; and (e) sealing the semiconductor chip, second base material, and conductive members with resin so that part of the second side surfaces of the second base material and the second main surface of the second base material are exposed to form a sealing body. The sealing body is formed by the steps of: (e1) preparing a molding die having an upper die and a lower die opposed to the upper die; (e2) arranging a film between the upper die and the lower die; (e3) arranging the first base material mounted with the semiconductor chip and the second base material between the film and the lower die; (e4) after the step (e3), clamping the upper die and the lower die to cause part of the second base material to bite into the film; (e5) after the step (e4), supplying the resin to between the film and the lower die to form the sealing body; and (e6) after the step (e5), opening the upper die and the lower die to take the first base material with the sealing body formed thereover out of the molding die.

The following is a brief description of the gist of effects obtained by the representative elements of the invention laid open in this application:

The reliability of a semiconductor device can be enhanced.

DETAILED DESCRIPTION OF THE PREFERRED EMBODIMENTS (Style of Description, Basic Terms, and Usage Thereof in this Specification)

The description of embodiments in this specification is divided into multiple sections or the like as required for the sake of convenience. These sections or the like are not independent of or separate from one another unless otherwise explicitly stated. Each section or the like is each part of a single example and one section is the details of part of another or a modification or the like to part or all of another regardless of the order of description. The repetitive description of a similar part will be omitted as a rule. Each constituent element of the embodiments is not indispensable unless otherwise explicitly state, the number of constituent elements is theoretically limited, or the constituent element is contextually obviously indispensable.

Even when the wording of "X comprised of A" or the like is used in the description of the embodiments with respect to material, composition, or the like, what containing an element other than A as one of major constituent elements is not excluded. This applies unless otherwise explicitly stated or it is contextually obviously excluded. Examples will be taken. With respect to component, the above wording means that "X including A as a main component" or the like. A term of "silicon member" or the like is not limited to members of pure silicon and includes SiGe (silicon germanium) alloys, other multi-element alloys predominantly comprised of silicon, and members containing other additive or the like, needless to add. The terms of gold plate, copper layer, nickel plate, and the like include not only pure ones but also members respectively predominantly comprised of gold, copper, nickel, and the like unless otherwise explicitly stated.

When reference is made to any specific numeric value or quantity, the specific numeric value or quantity may be exceeded or may be underrun. This applies unless otherwise explicitly stated, any other specific numeric value or quantity is theoretically impermissible, or the specific numeric value or quantity contextually may not be exceeded or underrun.

<Structure of Semiconductor Device>

Figure 1:
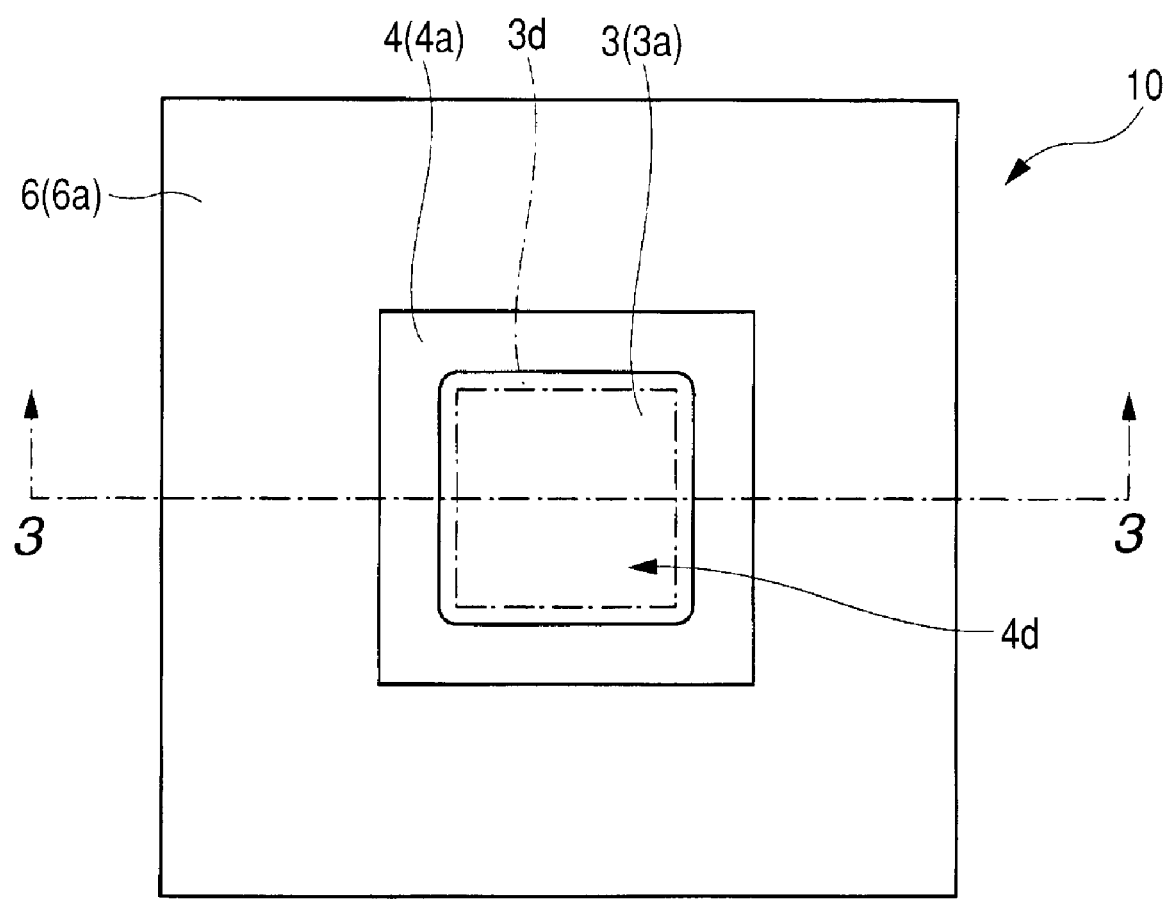
FIG. 1 is a plan view illustrating the upper surface side of a semiconductor device in an embodiment of the invention.
Figure 2:
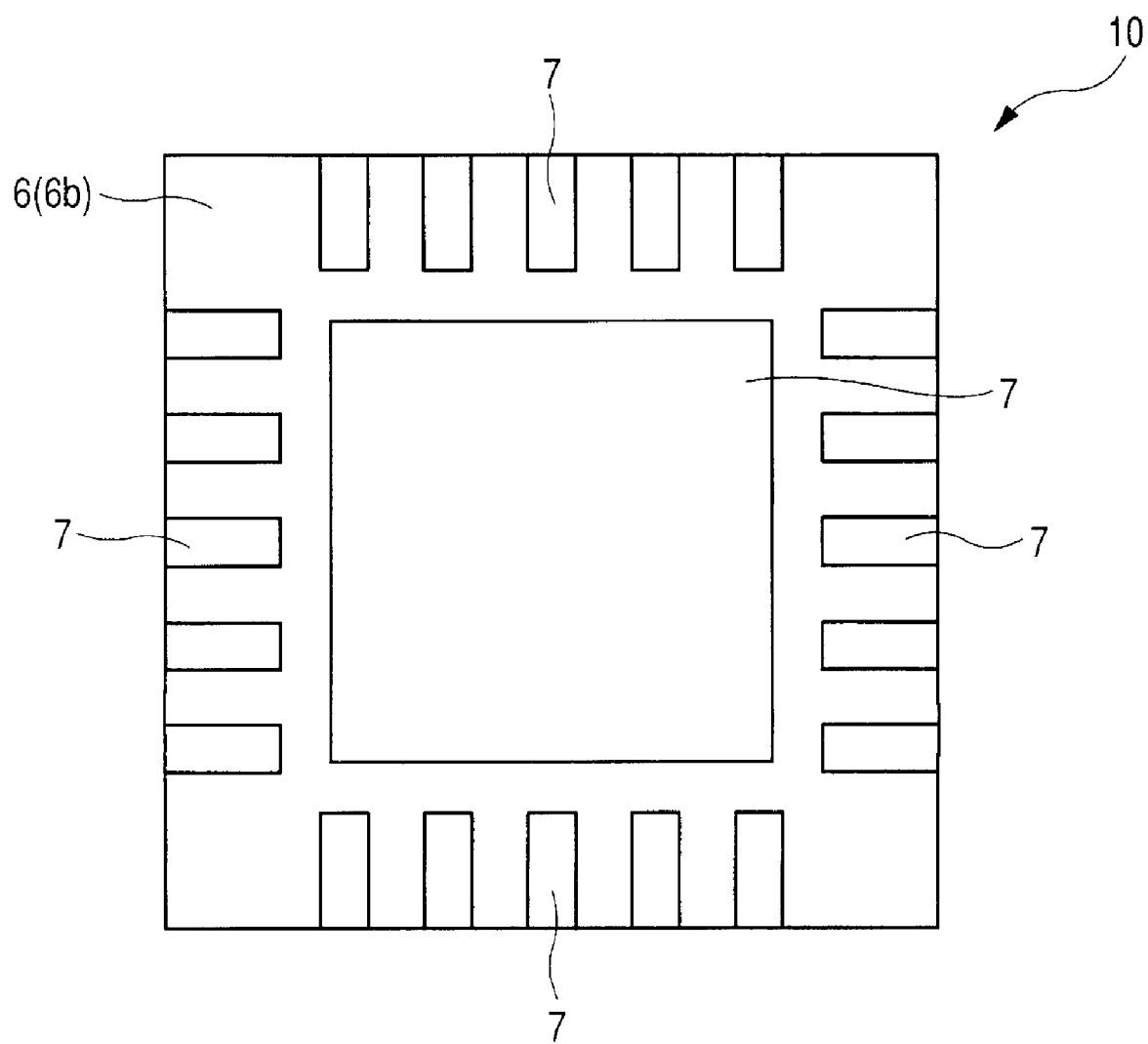
FIG. 2 is a plan view illustrating the under surface side of the semiconductor device illustrated in FIG. 1.
Figure 3:
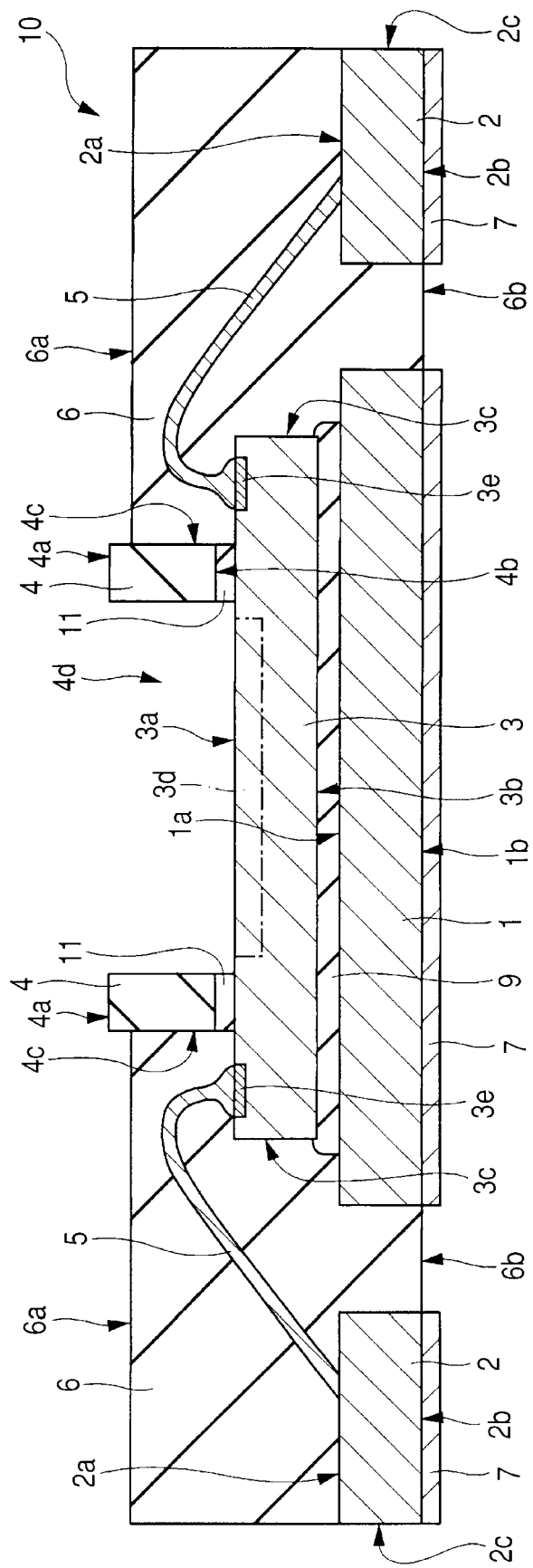
FIG. 3 is a sectional view taken along line A-A of FIG. 1.
Figure 4:
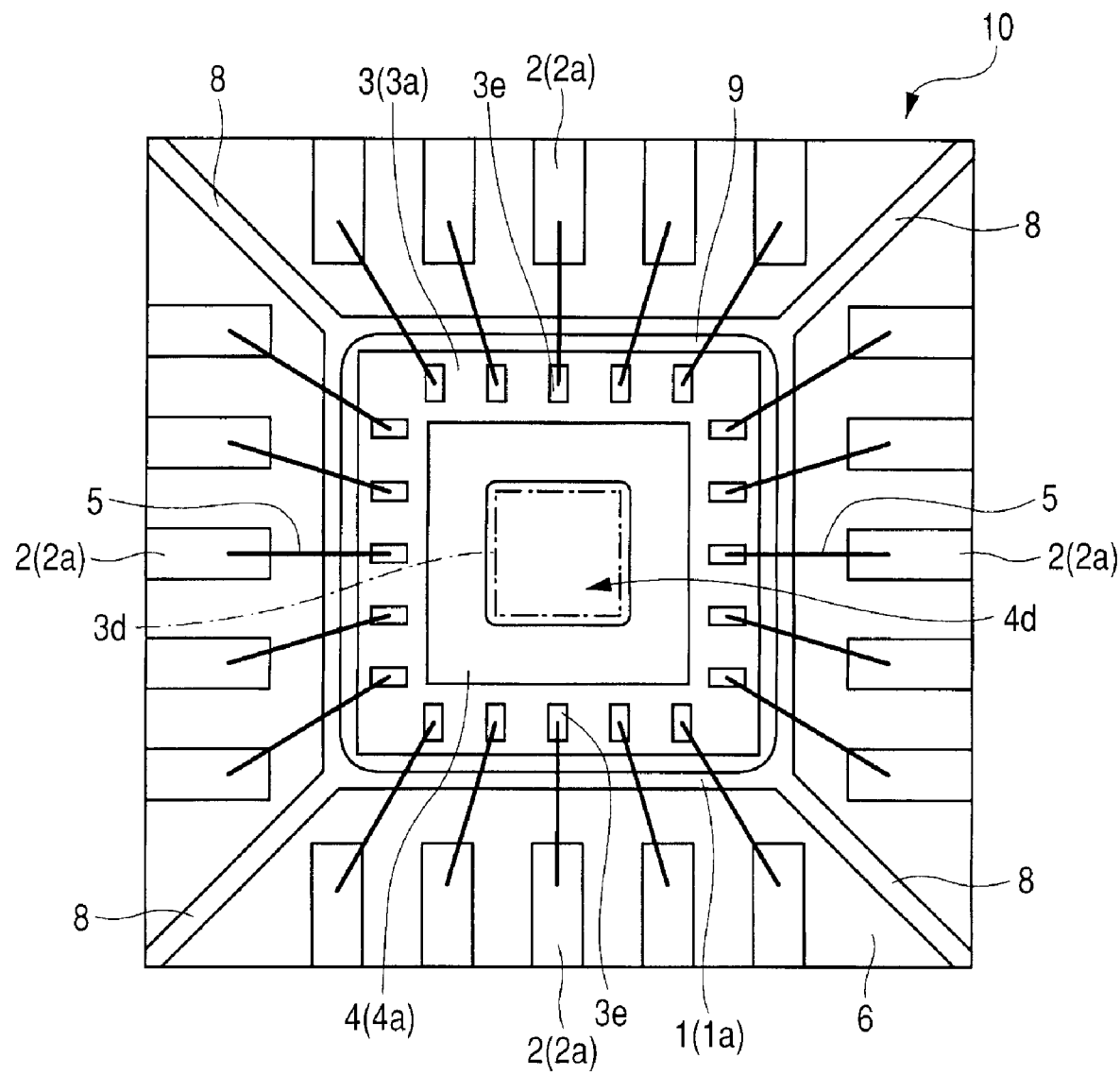
FIG. 4 is a plan view illustrating the planar structure of the semiconductor device illustrated in FIG. 1 in its sealing body.

Description will be given to the general configuration of a semiconductor device in this embodiment with reference to FIG. 1 to FIG. 4. FIG. 1 is a plan view illustrating the upper surface side of the semiconductor device in this embodiment; FIG. 2 is a plan view illustrating the under surface side of the semiconductor device illustrated in FIG. 1; and FIG. 3 is a sectional view taken along line A-A of FIG. 1. FIG. 4 is a plan view illustrating the planar structure of the semiconductor device illustrated in FIG. 1 in its sealing body. For this reason, FIG. 4 is drawn as a plan view illustrating the internal structure seen through the sealing body so that the internal configuration can be understood.

The semiconductor device in this embodiment is a lead frame-type semiconductor package in which a semiconductor chip is mounted over a tab, or a chip mounting area, of a lead frame (first base material, substrate) as a base material. In the description of this embodiment, QFN (Quad Flat Non-leaded Package) 10 as a lead frame-type semiconductor device as illustrated in FIG. 1 will be taken as an example.

For lead frame-type semiconductor devices, cost reduction techniques accumulated over the years can be utilized. In addition, already built infrastructures, such as manufacturing facilities, can be utilized. Therefore, lead frame-type semiconductor devices make it possible to reduce manufacturing costs as compared with substrate-type semiconductor devices in which a semiconductor chip is mounted over a wiring substrate.

In the QFN 10 in this embodiment, multiple leads as external connecting terminals are exposed from the under surface (the under surface 6b of a sealing body 6) side of the QFN 10. Therefore, QFNs make it possible to reduce the size of a semiconductor device as compared with QFPs (Quad Flat Packages) with multiple leads led outward from a side surface of a semiconductor device.

As illustrated in FIG. 1 to FIG. 3, the QFN 10 in this embodiment includes a tab (chip mounting area) 1; multiple leads (electrode areas) 2 arranged around the tab 1; a semiconductor chip 3 mounted over the upper surface 1a of the tab 1; a base material (second base material, frame body, member, frame-like member) 4 mounted over the main surface 3a of the semiconductor chip 3 and having a frame-like planar shape; multiple wires (conductive members) 5 respectively electrically coupling together the semiconductor chip 3 and the leads 2; and a sealing body 6 sealing the semiconductor chip 3 and the wires 5. The planar shape of the planes of the QFN 10 perpendicular to the direction of its thickness is rectangular and in this embodiment, it is square with the length of each side, for example, 3 mm to 4 mm or so.

Hereafter, detailed description will be given to each configurational element.

The tab 1 has an upper surface 1a and an under surface 1b on the opposite side to the upper surface 1a. The under surface 1b of the tab 1 is exposed on the under surface 6b side of the sealing body 6 and an external plating layer 7 is formed on its surface. The external plating layer 7 is formed to enhance a junction characteristic when the QFN 10 is mounted over a mounting board. Therefore, it is formed of a joining material used when the semiconductor device is mounted over a mounting board, for example, a metal material such as solder. In this embodiment, the external plating layer 7 is comprised of solder containing substantially no Pb (lead), so-called lead-free solder, which is comprised of, for example, only Sn (tin), Sn (tin)-Bi (bismuth), Sn (tin)-Ag (silver)-Cu (copper), or the like. Lead-free solder cited here refers to solder whose lead (Pb) content is 0.1 wt % or less and this content is stipulated as a standard of the RoHs (Restriction of Hazardous Substances) Directive.

The planar shape of the tab 1 (the planar shape of its planes perpendicular to the direction of its thickness) is rectangular and in this embodiment, it is square. The area of the upper surface 1a of the tab 1 is larger than the area of the back surface 3b of a mounted semiconductor chip 3.

Multiple hanging leads 8 are arranged around the tab 1 and the tab 1 is supported by these hanging leads 8. The hanging leads 8 are formed integrally with the tab 1. One end of each hanging lead is coupled to the peripheral edge (each of the four corners of the tab 1 in FIG. 4) of the tab 1 and the lead is extended to the outer edge of the QFN 10. The under surface side (not shown) of each hanging lead 8 has undergone thinning processing, such as half etching. For this reason, the hanging leads 8 are not exposed on the under surface (the under surface 6b of the sealing body 6) side of the QFN 10 and are sealed with the sealing body 6.

Each of the leads 2 arranged around the tab 1 is an external connecting terminal of the QFN 10 and has an upper surface 2a and an under surface 2b positioned on the opposite side thereto. These under surfaces 2b are exposed on the under surface side of the sealing body 6 like the under surface 1b of the tab 1 and an external plating layer 7 is formed on their surfaces. One side surface 2c of the four side surfaces 2c of each lead 2 is also exposed from a side surface of the sealing body 6. The upper surface 2a of each lead 2 is a bonding surface for bonding a wire 5 as a conductive member. A plating layer (not shown) comprised of a single metal layer or obtained by laminating multiple metal layers is formed there to enhance the strength of bond between each wire 5 and each lead 2 or reduce the electrical resistance at the joint area between each wire 5 and each lead 2.

The above-mentioned tab 1, hanging leads 8, and leads 2 form part of a lead frame used in the QFN 10 fabrication stage. That is, the QFN 10 is a lead frame-type semiconductor device in which a semiconductor chip 3 is mounted over a tab 1, or a chip mounting area, of a lead frame. For this reason, the tab 1, hanging leads 8, and leads 2 are formed using the same metal material as a core material. In this embodiment, for example, the tab 1, hanging leads 8, and leads 2 are comprised of Cu (copper).

A semiconductor chip 3 is bonded over the upper surface 1a of the tab 1 through first adhesive 9. The semiconductor chip 3 has a main surface 3a, a back surface 3b positioned on the opposite side to the main surface 3a, and side surfaces 3c positioned between the main surface 3a and the back surface 3b. The chip is so arranged that the back surface 3b is opposed to the upper surface 1a of the tab 1. That is, the semiconductor chip is mounted face up.

For the first adhesive 9, any material commonly used in die bonding of a semiconductor chip can be used. In this embodiment, a thermosetting resin obtained by adding additive, such as a curative agent, to epoxy resin or the like is used. The thermosetting resin is generally used as paste adhesive and various additives can be easily added according to design requirements. It is commonly used as adhesive for die bonding and can be very inexpensively procured; therefore, the manufacturing cost of the QFN 10 can be reduced.

Conductive adhesive, designated as so-called silver paste, prepared by dispersing metal filler of Ag (silver) or the like in thermosetting resin can also be used. Adding metal filler to the first adhesive 9 makes it possible to electrically couple the back surface 3b of the semiconductor chip 3 and the tab 1 with each other. For this reason, it is possible to supply reference potential or power supply potential to the semiconductor chip 3 through the tab 1. The metal filler is higher in coefficient of thermal conductivity than resin. Therefore, the coefficient of thermal conductivity of the first adhesive 9 is enhanced by adding metal filler and thus heat produced at the semiconductor chip 3 can be efficiently emitted.

The planar shape of the planes of the semiconductor chip 3 perpendicular to the direction of its thickness is rectangular and in this embodiment, it is square with the length of each side, for example, approximately 2 mm. The semiconductor chip 3 is comprised of, for example, silicon (Si).

In the main surface 3a of the semiconductor chip 3, there are formed a light receiving area (sensor area) 3d for receiving light and a conversion circuit for converting received light into an electrical signal. In the main surface 3a, further, there are formed multiple pads 3e electrically coupled with the light receiving area 3d. The pads 3e are respectively electrically coupled with the leads 2 through wires 5 as conductive members. That is, the semiconductor chip 3 is a photosensor-type semiconductor chip that converts received light into an electrical signal and outputs this signal to an external source and the QFN 10 in which the semiconductor chip 3 is mounted is a photosensor-type semiconductor device.

Photosensor-type semiconductor devices are applied to various applications including: solid-state image pickup devices such as CCD (Charge Coupled Device) or CMOS (Complementary Metal Oxide Semiconductor) image sensors; optical pickup devices that take light signals in a predetermined wavelength range out of recording media such as CD (Compact Disc) or DVD (Digital Versatile Disc) and convert the light signals into electrical signals; the photosensor area (photosensor device) of optical communication devices using laser light in a predetermined wavelength band;

and the like. The QFN 10 in this embodiment is, for example, a photosensor semiconductor device incorporated into an optical pickup device.

In the light receiving area 3*d* of the main surface 3*a*, there are formed multiples semiconductor light receiving elements, such as photodiodes and phototransistors.

With the light receiving area 3*d* exposed, as mentioned above, there is concern that a contamination will stick to the light receiving area 3*d*. There is also concern that the light receiving area 3*d* will be flawed by this contamination. A contamination sticking to the light receiving area 3*d* and a flow in the light receiving area 3*d* contribute to degradation in the reliability of the QFN 10 as a photosensor; therefore, it is required to prevent the adhesion of a contamination. If the light receiving area 3*d* is sealed with a sealing body 6 generally low in transmittance to visible light, the light receiving area 3*d* can be protected but light is intercepted. As a result, the functions of the photosensor cannot be fulfilled. Meanwhile, if an optically transparent member, such as cover glass, is arranged over the light receiving area 3*d*, transmitted light undergoes attenuation, refraction, or the like and there is concern that the detection efficiency, sensitivity, or the like of the photosensor will be degraded.

To cope with this, the following measure is taken in this embodiment: a base material 4 having an opening (through hole) 4*d* extended from the main surface (second main surface) 4*a* to the back surface (second back surface) 4*b* around the light receiving area 3*d* is arranged (bonded) over the main surface 3*a* of the semiconductor chip 3; and the surface of the light receiving area 3*d* is exposed form the sealing body 6 in the opening 4*d* in the base material 4. This makes it possible to prevent degradation in the detection efficiency, sensitivity, and the like of the photosensor. The opening 4*d* in the base material 4 is covered with a protective sheet (described in detail later) arranged over the main surface 4*a* at least during the manufacturing process for the QFN 10. This makes it possible to prevent a contamination from dropping onto the exposed light receiving area 3*d* during the manufacturing process for the QFN 10.

The base material 4 includes: the main surface 4*a*; the back surface 4*b* on the opposite side to the main surface 4*a*; side surfaces (second side surfaces) 4*c* positioned between the main surface 4*a* and the back surface 4*b*; and the opening 4*d* extended from the main surface 4*a* to the back surface 4*b*. The base material 4 is mounted over the main surface 3*a* of the semiconductor chip 3 through second adhesive 11 so that the back surface 4*b* is opposed to the main surface 3*a* of the semiconductor chip 3. The outer shape of the planes of the base material 4 perpendicular to the direction of its thickness is rectangular and in this embodiment, it is square with the length of each side, for example, approximately 1 mm.

The base material 4 is required to have a certain degree of hardness (rigidity) to ensure the shape of the opening 4*d*. A heating process may be carried out during the manufacturing process for the QFN 10 or after it is finished. If the base material 4 and the semiconductor chip 3 are different in coefficient of linear expansion, the positional relation between the semiconductor chip 3 and the base material 4 may be destroyed by thermal expansion during heating or shrinkage after heating. Therefore, when a material of the base material 4 is selected, it is desirable to consider making its coefficient of linear expansion close to that of the semiconductor chip 3. In this embodiment, Si, which is the same conductor material as the material forming the semiconductor chip 3, is used as the material of the base material 4 from this viewpoint.

The base material 4 has a function as a protection barrier that prevents encapsulation resin from flowing to over the light receiving area 3*d* of the semiconductor chip 3 during molding at a sealing step of forming the sealing body 6. For this reason, the base material 4 is formed in the shape of a frame encompassing the light receiving area 3*d* and is firmly bonded over the main surface 3*a* of the semiconductor chip 3 through the second adhesive 11.

The base material 4 and the second adhesive 11 are arranged above the light receiving area 3*d* in the main surface 3*a* of the semiconductor chip 3. However, since Si as the material of the base material 4 is impenetrable to light, the following measure is taken to let projected light projected to the upper surface of the QFN 10 arrive at the light receiving area 3*d*: in the main surface 3*a*, the entire light receiving area 3*d* is positioned inside the opening 4*d* and exposed. In other words, in the main surface 3*a* of the semiconductor chip 3, the range of the opening 4*d* in the base material 4 is wider than the range of the region where the light receiving area 3*d* is formed. Also in the second adhesive 11, an opening having, for example, the same dimensions as those of the opening 4*d* in the base material 4 is similarly formed. Thus the entire light receiving area 3*d* is exposed from the opening in the second adhesive 11. In the main surface 3*a*, in other words, the second adhesive 11 is arranged outside the outer edge of the light receiving area 3*d*. This makes it possible to maintain the positional relation between the light receiving area 3*d* of the semiconductor chip 3 and the opening 4*d* in the base material 4 and to let all projected light arrive at the light receiving area 3*d*. Therefore, the reliability of the QFN 10 can be enhanced.

When the QFN 10 is applied to, for example, a solid-state image pickup device such as a CCD or CMOS image sensor, it is preferable that such a member as a micro lens should be arranged over the light receiving area 3*d*. Since the QFN 10 has the opening 4*d*, a space for arranging such a member can be ensured.

The material of the base material 4 or the second adhesive 11 is not limited to the foregoing. When they are comprised of, for example, a member transparent to visible light, it is possible to let projected light arrive at the entire light receiving area 3*d* even in the following case: a case where part of the light receiving area 3*d* overlaps with part of the base material 4 or the second adhesive 11.

In this case, however, it is required that at least the entire light receiving area 3*d* should be optically transparent to the extent that it can be viewed from the upper surface side of the QFN 10. Especially, in a photosensor-type semiconductor device incorporated into an optical pickup device, it is required to take the following measure with respect to spectral transmittance in the wavelength band of projected light as a light signal: the spectral transmittance of the base material 4 and the second adhesive 11 is made higher than the spectral transmittance of the sealing body 6. When the QFN 10 is incorporated into, for example, an optical pickup device for DVD using a blue semiconductor laser with a wavelength of 405 nm, a spectral transmittance of 95% or higher is required in a wavelength band in proximity to 405 nm that is the wavelength of projected light.

Therefore, when part of the base material 4 overlaps with part of the light receiving area 3*d*, it is desirable to use a glass material as a noncrystalline solid for the base material 4. The second adhesive 11 is required to have, in addition to a high spectral transmittance characteristic, bonding strength for bonding together the back surface 4*b* of the base material 4 and the main surface 3*a* of the semiconductor chip 3. Therefore, it is desirable to use a very transparent thermoplastic resin, such as a fluorine resin, an acrylic resin, or a polycarbonate resin. The reason why thermoplastic resin should be used is as follows: when thermosetting resin is used for the second adhesive 11, it is required to add much non-transparent material, such as curative agent. For this reason, to enhance the spectral transmittance characteristic of the second adhesive 11, it is desirable to use thermoplastic resin, with which a ratio of added non-transparent material can be reduced.

Since noncrystalline solids of acrylic resin or polycarbonate are highly transparent, they can also be used as the material of the base material 4. However, when the QFN 10 is used as a photosensor device incorporated into an optical pickup device, especially high spectral transmittance characteristics are required as mentioned above. Therefore, it is desirable to use a noncrystalline material containing $SiO_2$ (silica) as a main ingredient from the viewpoint of spectral transmittance enhancement. Especially, silica glass is high in the purity of $SiO_2$ (silica) and is very high in the degree of transparency to visible light; therefore, it is especially desirable for the material of the base material 4 when the base material 4 is so arranged that it overlaps with the light receiving area 3d.

A structure in which part of the light receiving area 3d overlaps with part of the base material 4 or the second adhesive 11 is desirable from the viewpoint of the miniaturization of the QFN 10 in that: the ratio of the area occupied by the light receiving area 3d in the main surface 3a of the semiconductor chip 3 is increased. However, structures in which part of the light receiving area 3d overlaps with part of the base material 4 or the second adhesive 11 as mentioned above involve a problem. There are spectral transmittance requirements for the base material 4 and the second adhesive 11. Therefore, it is especially desirable to take the following measure from the viewpoint of the degree of freedom in material option: the entire light receiving area 3d is exposed from the opening 4d in the base material 4 and the opening in the second adhesive 11 as illustrated in FIG. 1 to FIG. 4.

The semiconductor chip 3 and the wires 5 are sealed with the sealing body 6. The semiconductor chip 3 and the wires 5 can be protected by sealing the semiconductor chip 3 and the wires 5 with the sealing body 6. The following advantage is obtained by exposing the entire light receiving area 3d from the opening 4d in the base material 4 and the opening in the second adhesive 11: a passage for receiving projected light is ensured and thus translucency to projected light is not requested of the sealing body 6. Therefore, when a material used for the sealing body 6 is selected, an optimal material can be selected taking the following into account: the mechanical strength, heat resistance, radiation performance, and mold release characteristics of the sealing body 6, stress applied to the semiconductor chip 3 and the base material 4, and the like. In this embodiment, for example, the following encapsulation resin is used as the material of the sealing body 6: encapsulation resin prepared by adding additives, such as filler for making its coefficient of linear expansion close to those of the semiconductor chip 3 and the base material 4, curative agent, and coloring agent to a base material of epoxy resin as a thermosetting resin.

Though the sealing body 6 also seals the base material 4, the base material 4 is not completely covered with the sealing body 6 and part thereof is exposed as illustrated in FIG. 3. Specifically, the main surface 4a of the base material 4 is completely exposed from the sealing body 6. Part (part on the main surface 4a side) of the side surfaces 4c of the base material 4 is also exposed from the sealing body 6. Description will be given from another viewpoint. The base material 4 has an exposed portion on the upper surface 6a side of the sealing body 6 and this exposed portion is protruded from the upper surface 6a of the sealing body 6. Description will be given from yet another viewpoint. The distance from the under surface 6b of the sealing body 6 to the main surface 4a of the base material 4 is longer than the distance from the under surface 6b to the upper surface 6a of the sealing body 6. These structures arise from a manufacturing method in which the adhesion of a contamination over the main surface 4a of the base material 4 is prevented during the manufacturing process for the QFN 10. The reason for this and the structure of the QFN 10 desirable from the viewpoint of the prevention of contamination adhesion will be described in detail when the manufacturing method for the QFN 10 is described.

<Manufacturing Method for Semiconductor Device>

Description will be given to the manufacturing method for the QFN 10 illustrated in FIG. 1 to FIG. 4.

Figure 5:
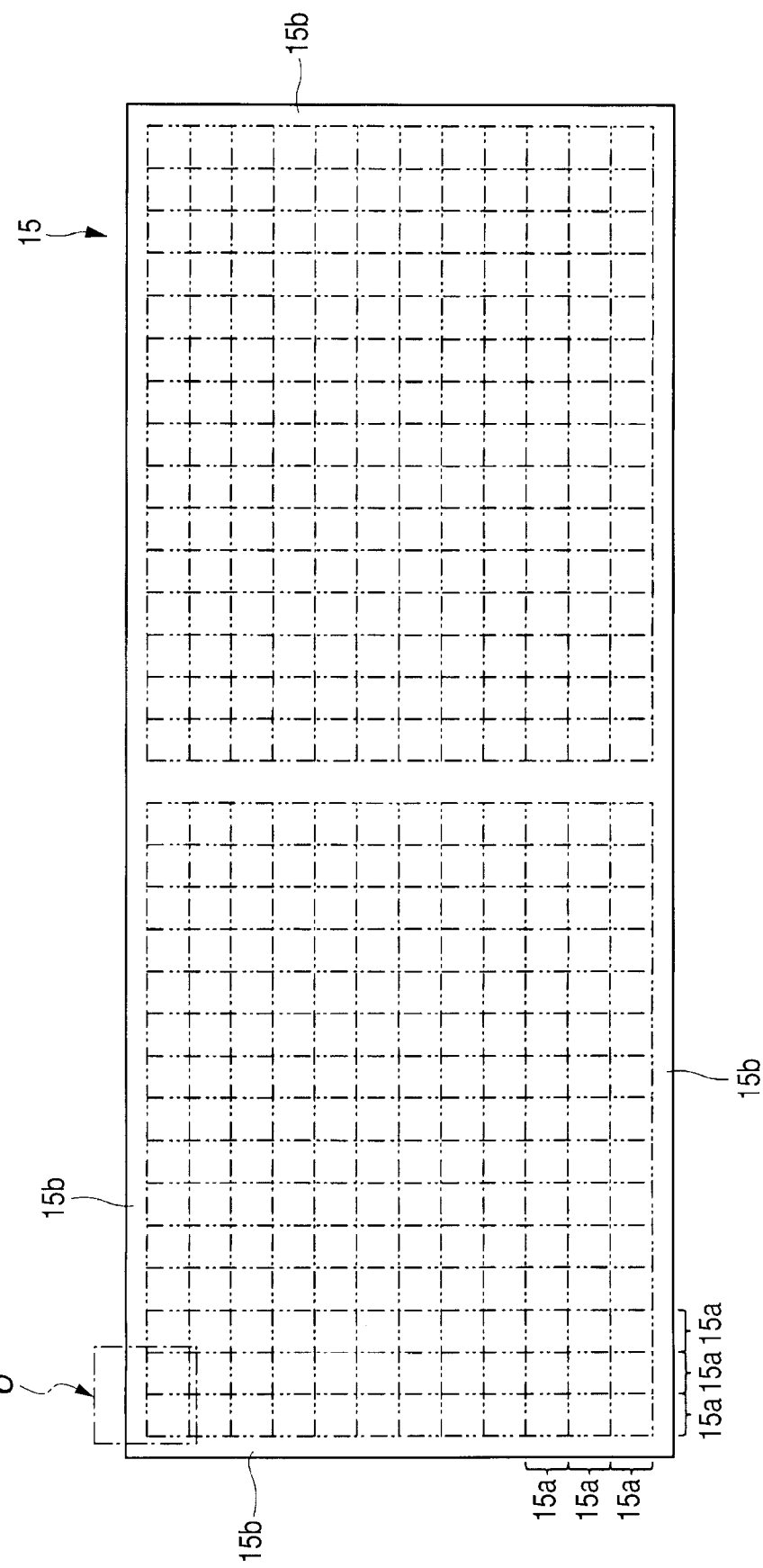
FIG. 5 is a plan view illustrating the brief overview of the overall structure of a lead frame used in the manufacture of a semiconductor device in an embodiment of the invention.
Figure 6:
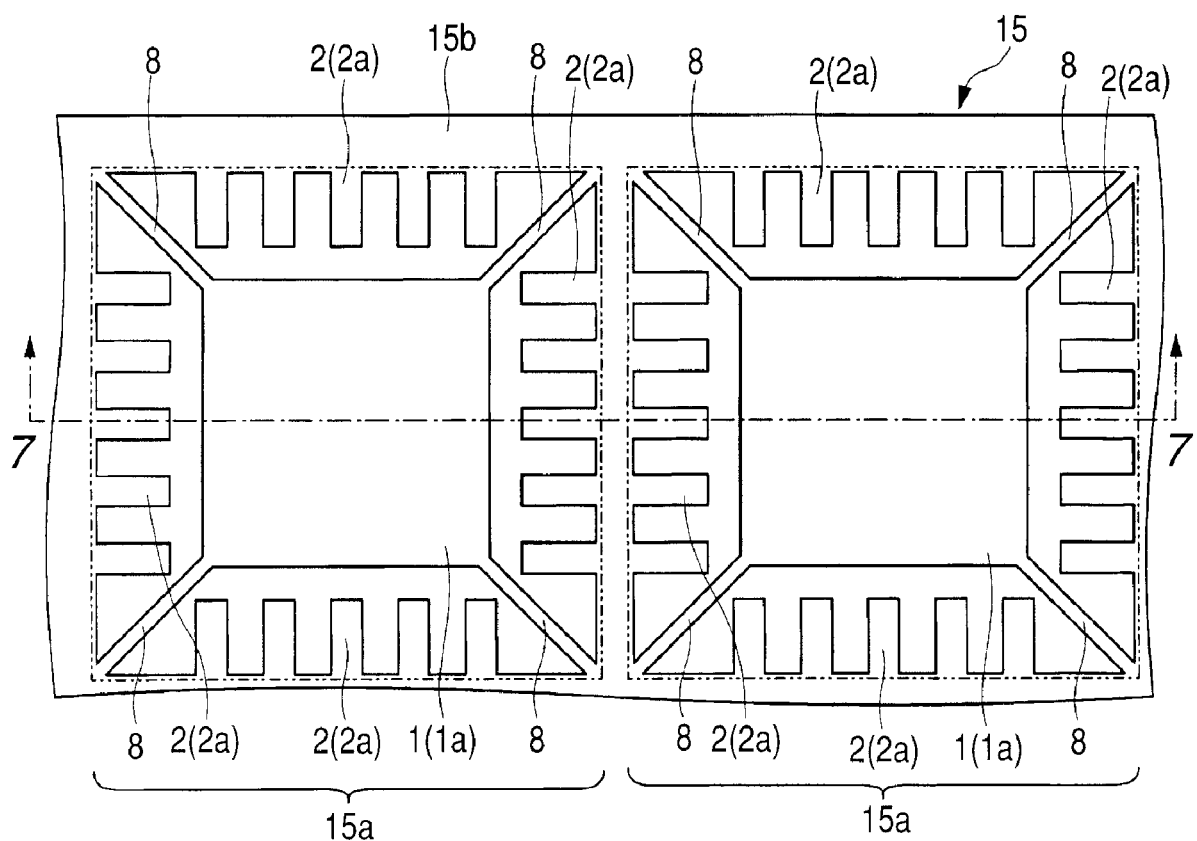
FIG. 6 is an enlarged sectional view illustrating B part illustrated in FIG. 5 in an enlarged manner.
Figure 7:
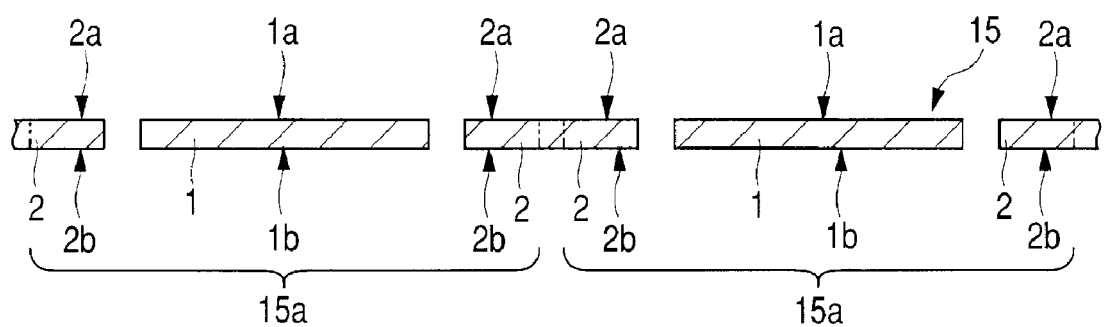
FIG. 7 is an enlarged sectional view taken along line C-C of FIG. 6.

First, the lead frame (base material, substrate) 15 illustrated in FIG. 5 to FIG. 7 is prepared (lead frame preparation step). FIG. 5 is a plan view illustrating the overall structure of the lead frame used for the manufacture of the semiconductor device in this embodiment; FIG. 6 is an enlarged sectional view illustrating B part illustrated in FIG. 5 in an enlarged manner; and FIG. 7 is an enlarged sectional view taken along line C-C of FIG. 6.

The lead frame 15 prepared at this step has multiple product formation regions (device formation regions) 15a (the individual regions encircled with alternate long and two short dashes lines in FIG. 5). Each product formation region 15a corresponds to one semiconductor device (QFN 10) illustrated in FIG. 1 to FIG. 4. The product formation regions 15a are coupled with one another through frame bodies 15b. As illustrated in FIG. 5, the product formation regions 15a are arranged in a matrix pattern. FIG. 5 illustrates the following structure: a structure in which two blocks each comprised of 12 product formation regions 15a arranged in the direction of row and 15 product formation regions arranged in the direction of column are coupled with each other in the direction of column.

As illustrated in FIG. 6, each of the product formation regions 15a of the lead frame 15 includes: a tab (chip mounting area) 1; multiple hanging leads 8 supporting the tab 1; and multiple leads 2 arranged around the tab 1. The frame bodies 15b of the lead frame are formed integrally with the hanging leads 8 and the leads 2.

The QFN 10 in this embodiment is a photosensor incorporated into an optical pickup device and the number of its external connecting terminals is relatively small. The QFN 10 illustrated in FIG. 1 to FIG. 4 as an example has 20 leads 2. In case of semiconductor devices small in the number of terminals as mentioned above, it is desirable to use a lead frame that does not require a wiring layer, an insulating layer, or the like for routing wires, from the viewpoint of manufacturing cost reduction. The lead frame 15 illustrated in FIG. 5 to FIG. 7 as an example is formed by press. Specifically, a metal plate as a row material of the lead frame 15 is pressed with a die and the shapes of the tab 1, leads 2, hanging leads 8, and the like are thereby formed as illustrated in FIG. 6. This presswork enables mass production using a die and thus makes it possible to reduce the manufacturing cost of the lead frame 15.

When importance is attached to the miniaturization and microminiaturization of semiconductor devices or when a wide variety of products are manufactured in small quantities, the lead frame may be formed by etching.

Figure 8:
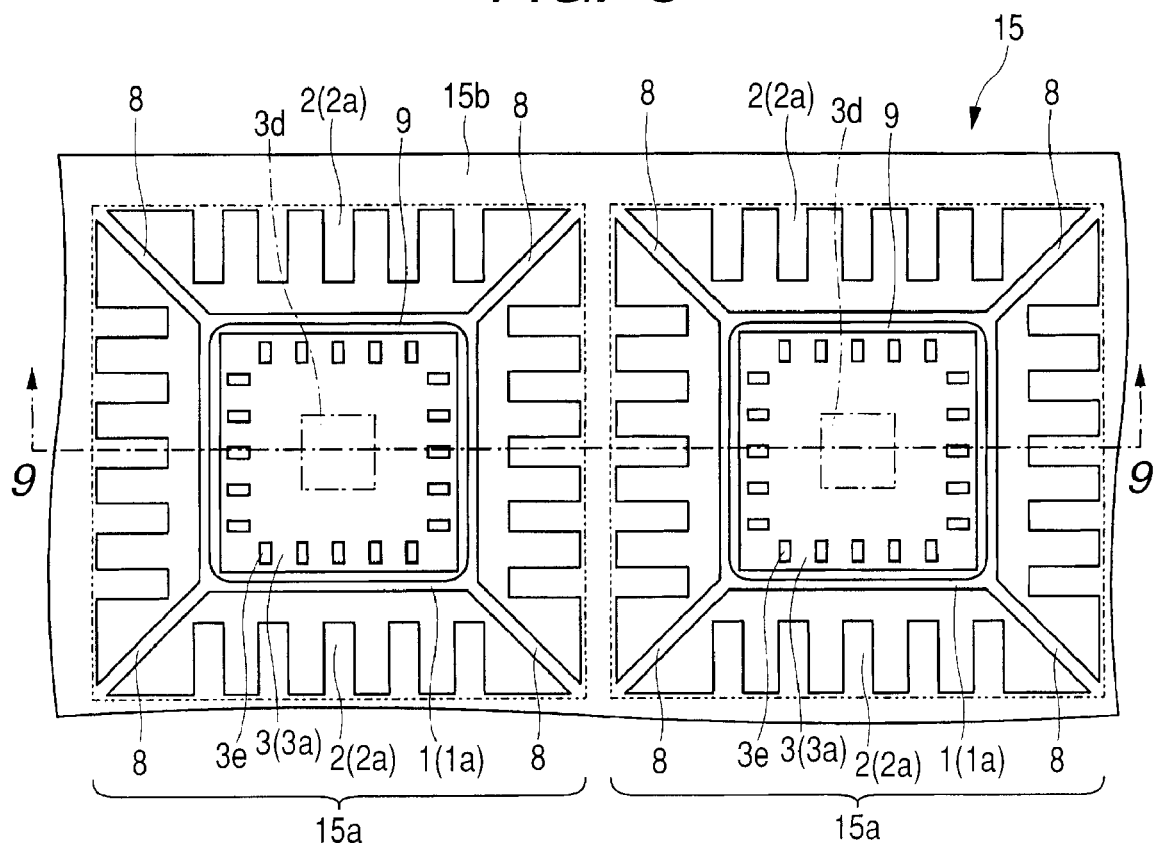
FIG. 8 is an enlarged plan view illustrating how semiconductor chips are mounted over the lead frame illustrated in FIG. 6.
Figure 9:
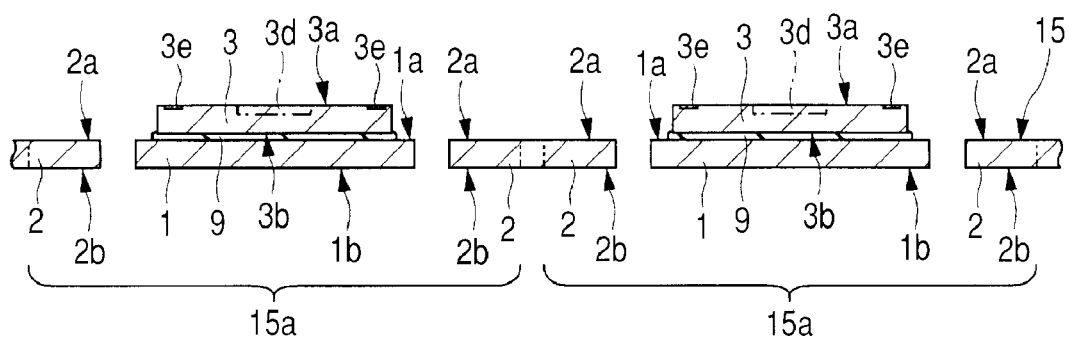
FIG. 9 is an enlarged sectional view taken along line C-C of FIG. 8.

As illustrated in FIG. 8 and FIG. 9, subsequently, semiconductor chips 3 are prepared and each of them is mounted over the upper surface 1a of a tab 1 through the first adhesive 9 (die bonding step). FIG. 8 is an enlarged plan view illustrating how semiconductor chips are mounted over the lead frame illustrated in FIG. 6 and FIG. 9 is an enlarged sectional view taken along line C-C of FIG. 8.

At this step, first, the above-mentioned semiconductor chips 3 are prepared. As mentioned above, each semiconductor chip 3 includes: a main surface 3a; a light receiving area (sensor area) 3d formed in the main surface 3a; multiple pads 3e formed in the main surface 3a and electrically coupled with the light receiving area 3d; a back surface 3b on the opposite side to the main surface 3a; and side surfaces positioned between the main surface 3a and the back surface 3b.

First adhesive 9 for fixing the semiconductor chip 3 and the tab 1 together is arranged over the upper surface 1a of each tab 1 of the lead frame 15. The first adhesive 9 used in this embodiment is comprised of paste thermosetting resin. For this reason, the first adhesive 9 is arranged by applying the paste adhesive over the upper surface 1a of each tab 1 of the lead frame 15.

As illustrated in FIG. 8 and FIG. 9, subsequently, each semiconductor chip 3 is arranged so that its back surface 3b is opposed to the upper surface 1a of each tab 1. At this time, it is desirable to taken the following means to prevent the main surface 3a of the semiconductor chip 3 from being at an angle to the upper surface 1a of the tab 1: when the semiconductor chip 3 is arranged, it is pressed from its main surface 3a side using a pressing jig (not shown) such as a collet. Pressing the semiconductor chip with a pressing jig makes it possible to make the main surface 3a of the semiconductor chip 3 substantially parallel with the upper surface 1a of the tab 1. As a result, therefore, the main surface of the base material 4 described later can be prevented from being at an angle to the upper surface 1a of the tab 1. Further, it is possible to make the thicknesses of multiple dots of the first adhesive 9 substantially constant from one product formation region 15a to another. Since the first adhesive 9 used in this embodiment is a thermosetting adhesive, the semiconductor chip 3 is fixed by taking the following measure: after the semiconductor chip 3 is arranged over the upper surface 1a of the tab 1, heat is applied to cure the first adhesive 9.

In the above description of this embodiment, a case where paste resin is used as the first adhesive 9 has been taken as an example. Instead, a resin film designated as DAF (Die Attach Film) having an adhesion layer on both sides may be used. Use of the DAF makes it possible to make the thickness of the first adhesive 9 further constant as compared with cases where paste resin is used. For this reason, the main surfaces 3a of the semiconductor chips 3 in the respective product formation regions 15a can be made substantially identical in profile.

In cases where DAF is used, however, the manufacturing cost is increased as compared with cases where paste resin is used. Paste resin is higher in the degree of freedom in the selection of material added to resin as the base material than DAFs. Therefore, an appropriate additive can be added according to requested specifications of bonding strength, linear coefficient of expansion, and the like. Therefore, it is desirable to use paste resin from these viewpoints.

Figure 10:
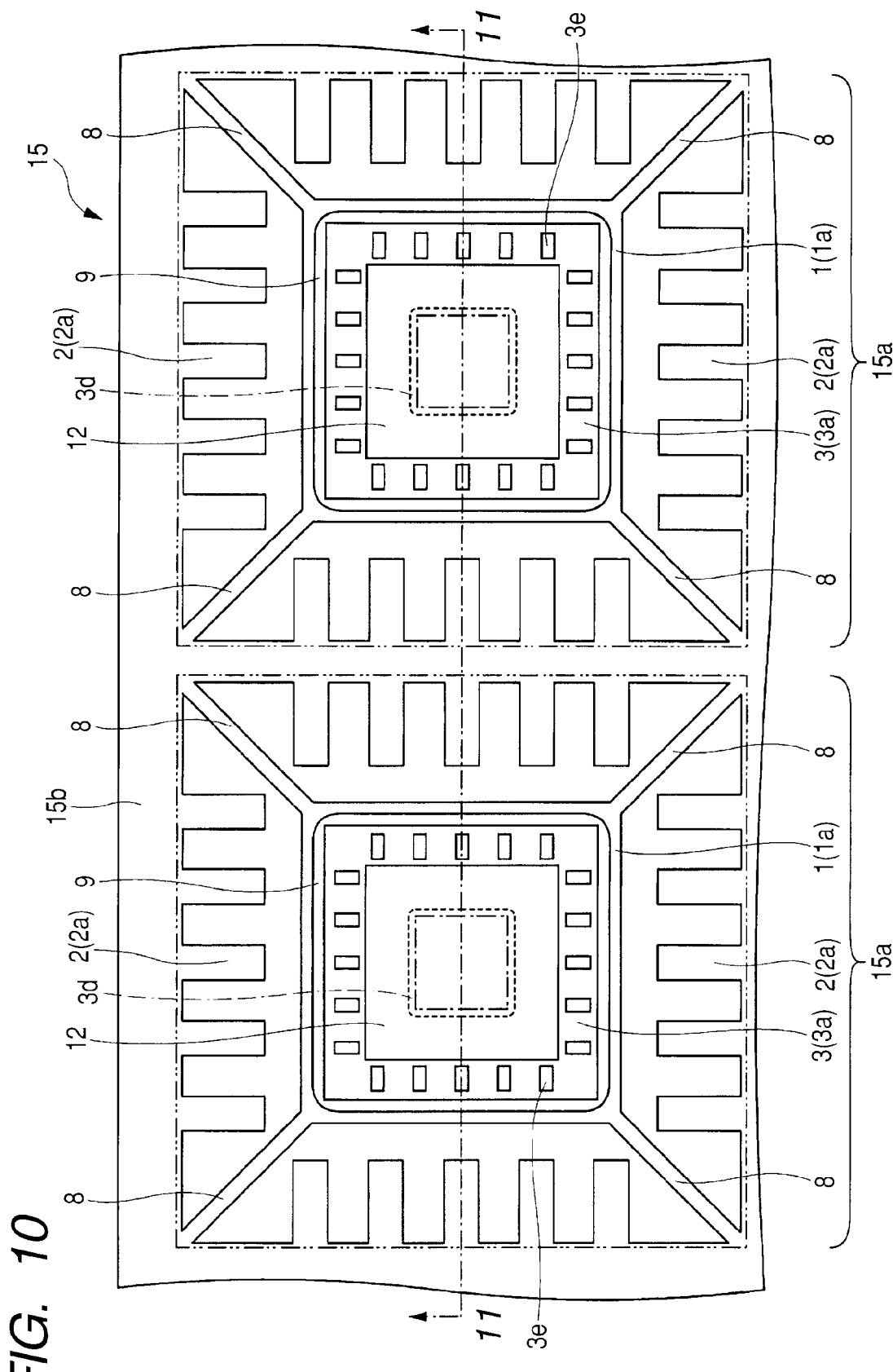
FIG. 10 is an enlarged plan view how a base material mounted over the semiconductor chips illustrated in FIG. 8.
Figure 11:
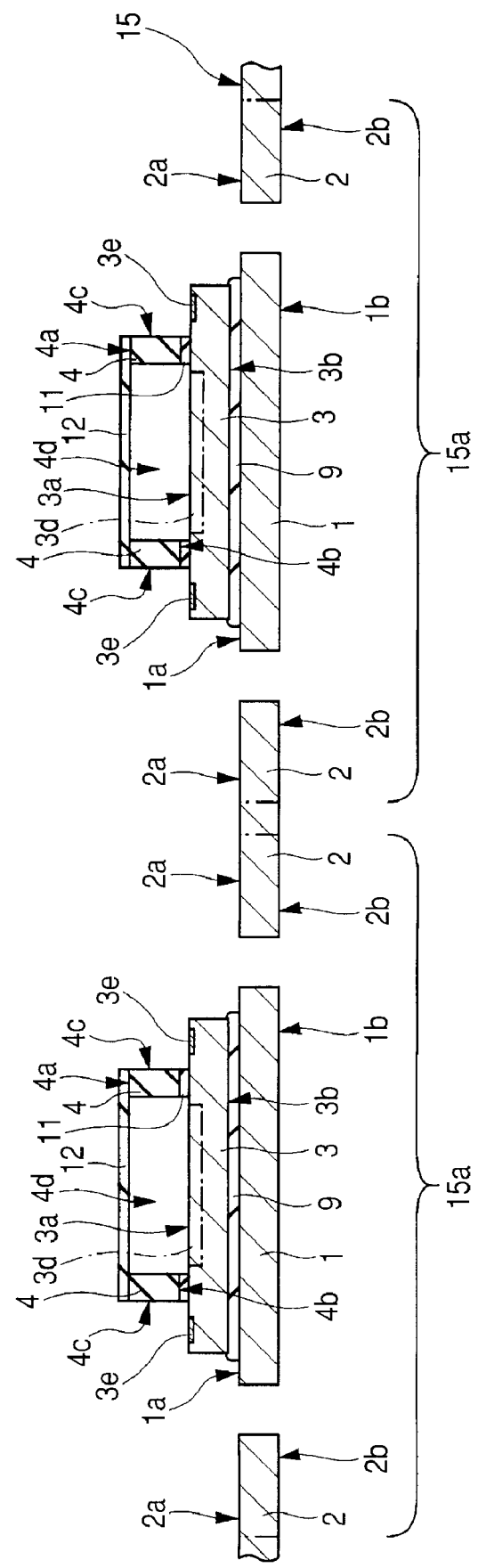
FIG. 11 is an enlarged sectional view taken along line C-C of FIG. 10.

As illustrated in FIG. 10 and FIG. 11, subsequently, a base material 4 is mounted over the main surface 3a of each semiconductor chip 3 through second adhesive 11 (base material mounting step). FIG. 10 is an enlarged plan view illustrating how base materials are mounted over the semiconductor chips illustrated in FIG. 8 and FIG. 11 is an enlarged sectional view taken along line C-C of FIG. 10.

Figure 12:
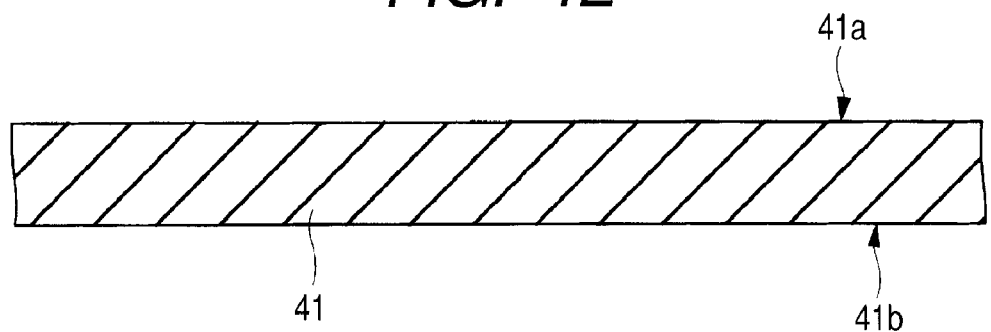
FIG. 12 is an enlarged sectional view illustrating a step of preparing a wafer for explanation of a method for forming a base material prepared at a base material mounting step.
Figure 13:
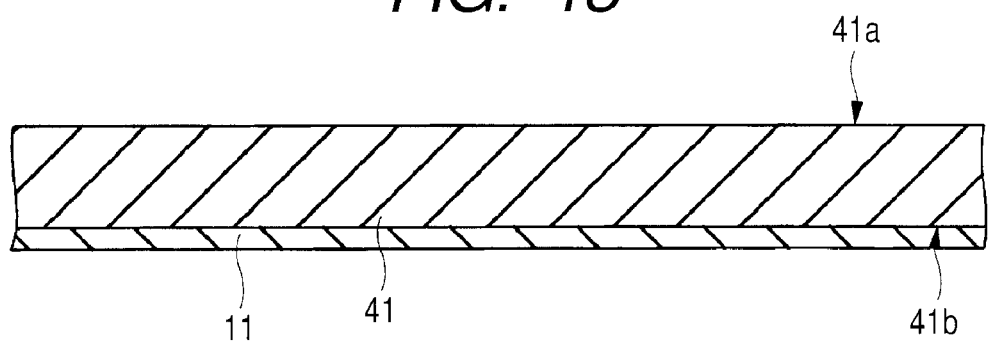
FIG. 13 is an enlarged sectional view illustrating a step of forming second adhesive for explanation of the method for forming the base material prepared at the base material mounting step.
Figure 14:
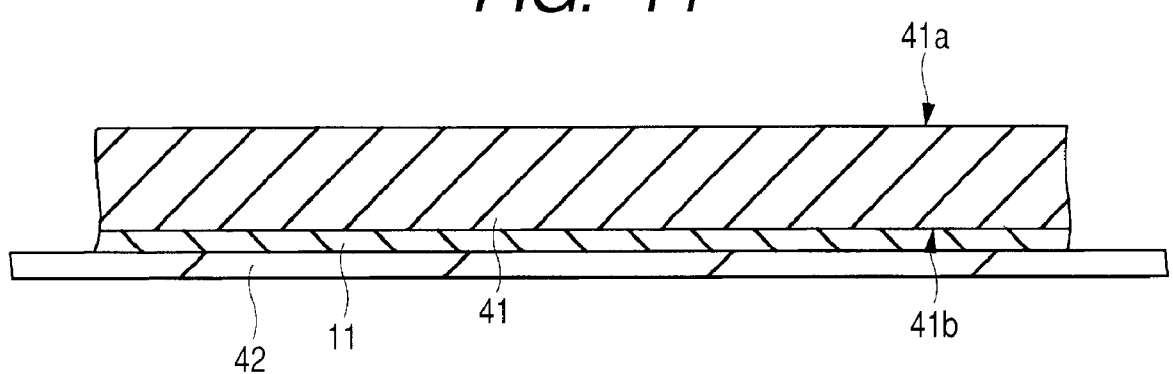
FIG. 14 is an enlarged sectional view illustrating a step of sticking a dicing tape for explanation of the method for forming the base material prepared at the base material mounting step.
Figure 15:
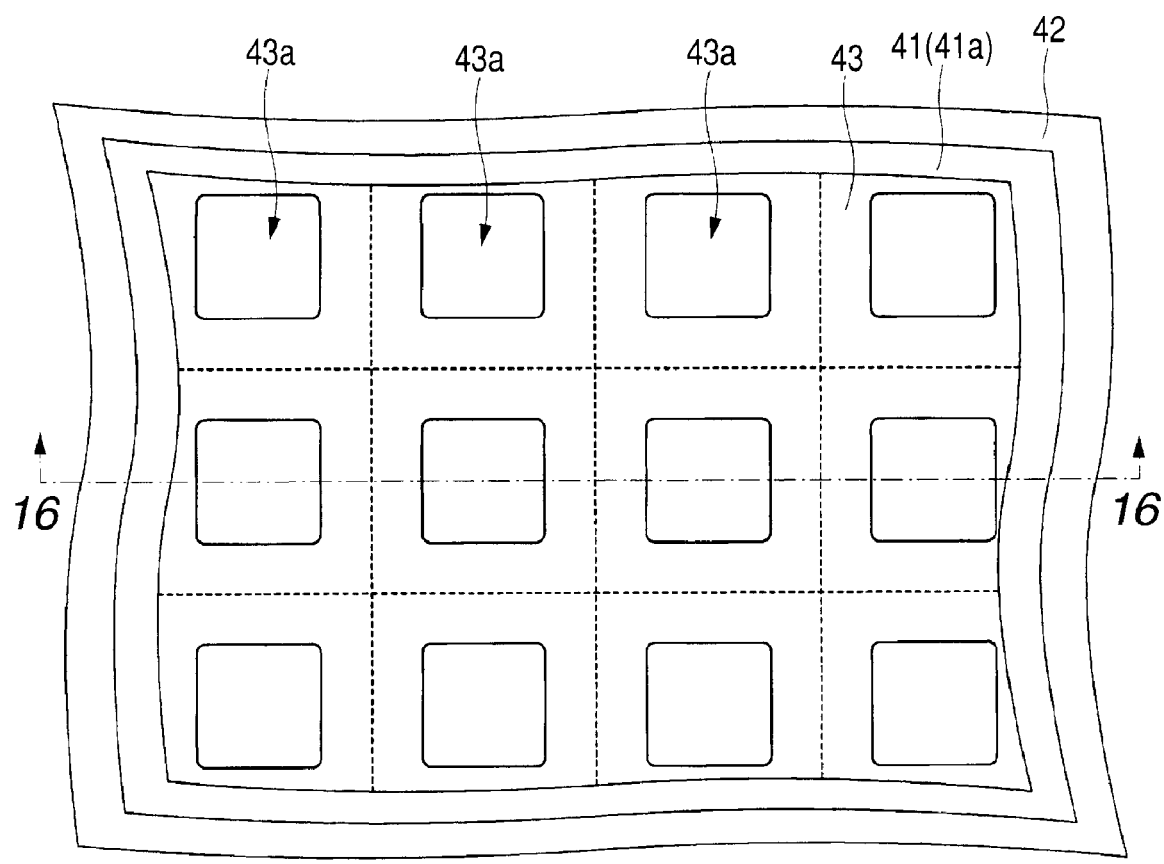
FIG. 15 is an enlarged plan view illustrating a step of sticking a mask for explanation of the method for forming the base material prepared at the base material mounting step.
Figure 16:
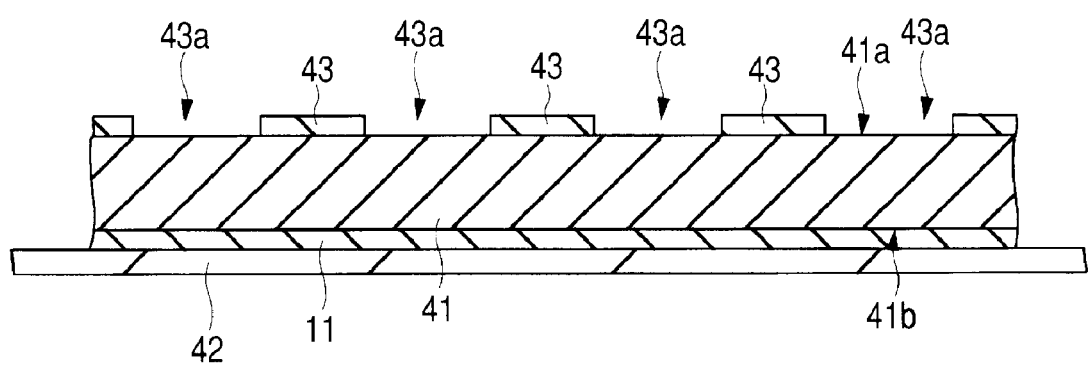
FIG. 16 is an enlarged sectional view taken along line F-F of FIG. 15.
Figure 17:
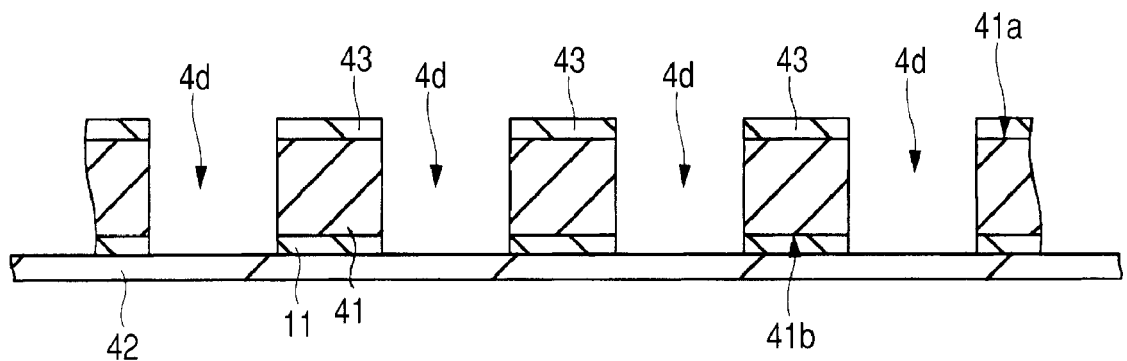
FIG. 17 is an enlarged sectional view illustrating a step of forming openings in the wafer and the second adhesive for explanation of the method for forming the base material prepared at the base material mounting step.
Figure 18:
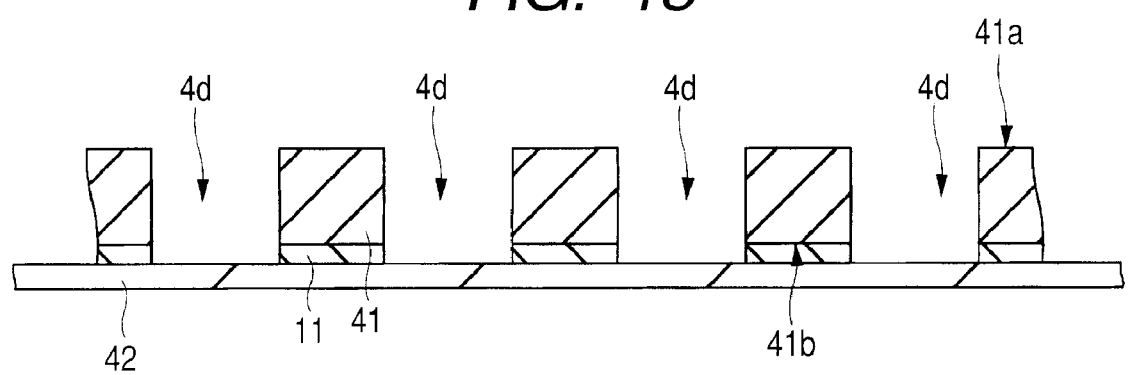
FIG. 18 is an enlarged sectional view illustrating a step of removing the mask illustrated in FIG. 17 and cleaning the wafer.
Figure 19:
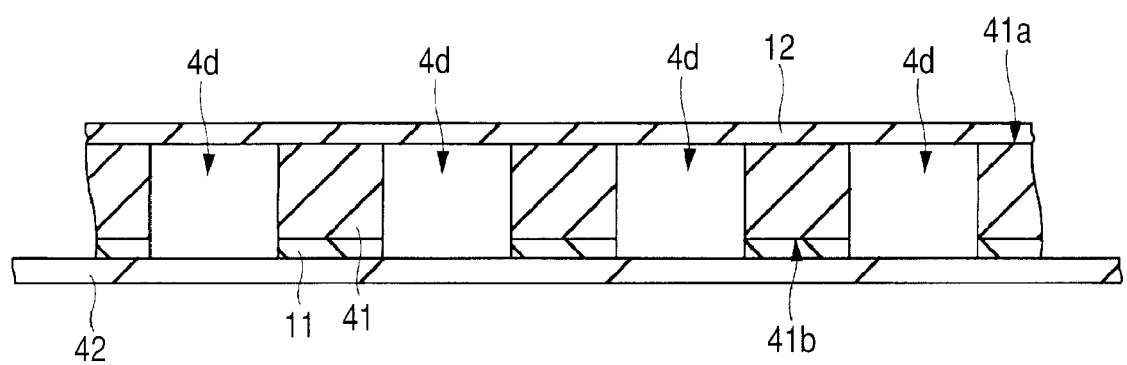
FIG. 19 is an enlarged sectional view illustrating a step of sticking a protective sheet to the main surface of the wafer for explanation of the method for forming the base material prepared at the base material mounting step.
Figure 20:
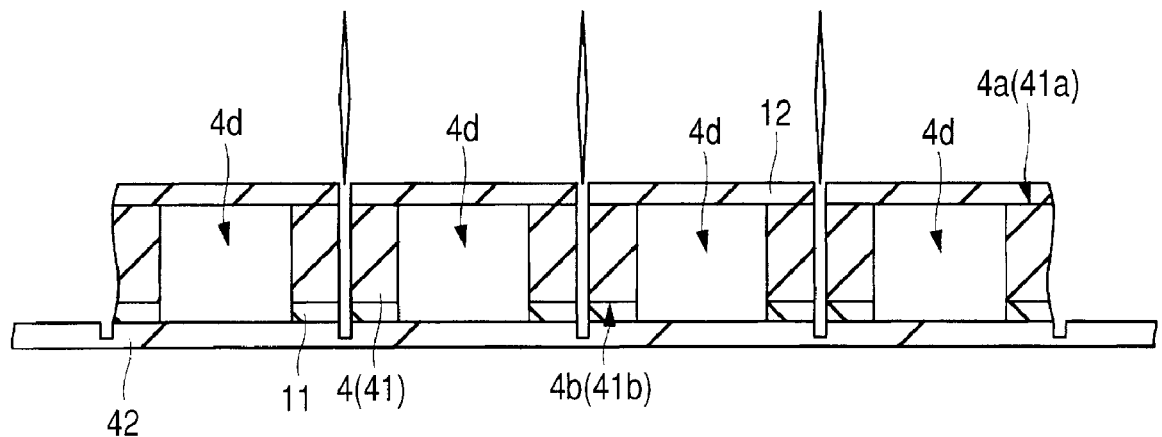
FIG. 20 is an enlarged sectional view illustrating a step of cutting the wafer into individual base materials for explanation of the method for forming the base material prepared at the base material mounting step.
Figure 21:
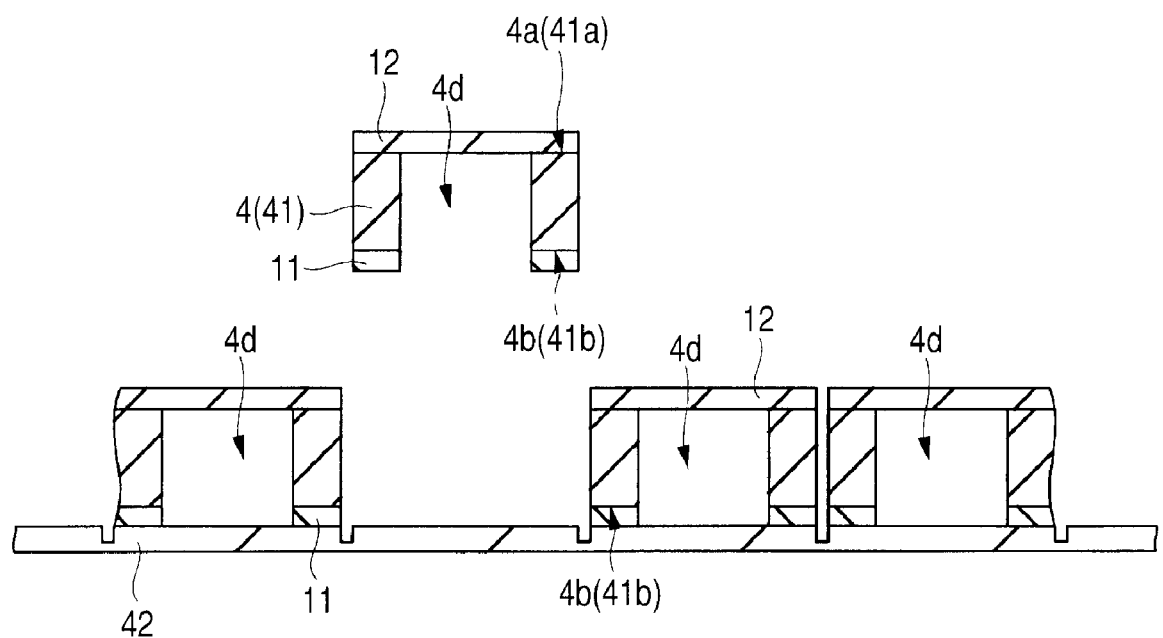
FIG. 21 is an enlarged sectional view illustrating a step of picking up a segmented base material for explanation of the method for forming the base material prepared at the base material mounting step.

At this step, first, the base materials 4 are prepared. As mentioned above, each base material 4 includes: a main surface 4a; a back surface 4b on the opposite side to the main surface 4a; side surfaces 4c positioned between the main surface 4a and the back surface 4b; and an opening 4d extended from the main surface 4a to the back surface 4b. A protective sheet 12 that covers the opening 4d is stuck beforehand to the main surface 4a of each base material 4. Second adhesive 11 comprised of hot-melt and thermosetting resin is stuck beforehand to the back surface 4b of each base material 4. The second adhesive 11 is formed in a frame shape. An opening extended from the upper surface to the under surface of the second adhesive 11 is formed in its area that overlaps with the opening 4d in the base material 4. The base material 4 with the protective sheet 12 and second adhesive 11 stuck beforehand thereto is formed, for example, as described below. The drawings from FIG. 12 to FIG. 21 explain a method for forming the base material prepared at the base material mounting step. FIG. 12 is an enlarged sectional view illustrating a step of preparing a wafer; FIG. 13 is an enlarged sectional view illustrating a step of forming the second adhesive; and FIG. 14 is an enlarged sectional view illustrating a step of sticking a dicing tape. FIG. 15 is an enlarged plan view illustrating a step of sticking a mask and FIG. 16 is an enlarged sectional view taken along line F-F of FIG. 15. FIG. 17 is an enlarged sectional view illustrating a step of forming openings in the wafer and the second adhesive. FIG. 18 is an enlarged sectional view illustrating a step of removing the mask illustrated in FIG. 17 and cleaning the wafer; FIG. 19 is an enlarged sectional view illustrating a step of sticking a protective sheet to the main surface of the wafer; FIG. 20 is an enlarged sectional view illustrating a step of cutting the wafer into individual base materials; and FIG. 21 is an enlarged sectional view illustrating a step of picking up a segmented base material.

As illustrated in FIG. 12, first, a flat plate larger than the base materials 4 to be prepared (Refer to FIG. 11) is prepared. Since the base material 4 is formed of Si in this embodiment, a wafer (Si wafer) 41 commonly used in the manufacture of semiconductor chips can be used. The wafer 41 includes a main surface 41a and a back surface 41b positioned on the opposite side to the main surface 41a. The main surface 41a corresponds to the main surface 4a of each base material 4 illustrated in FIG. 11 and the back surface 41b corresponds to the back surface 4b of each base material 4 illustrated in FIG. 11.

As illustrated in FIG. 13, subsequently, the second adhesive 11 is formed over the back surface 41b of the wafer 41. As mentioned above, the second adhesive 11 is comprised of a resin material having hot-melt and thermosetting properties and can be formed by lightly applying it to the back surface 41b and then drying it.

As illustrated in FIG. 14, subsequently, the dicing tape 42 is stuck to the back surface 41b side of the wafer 41, that is, its surface where the second adhesive 11 is formed. The dicing tape 42 only has to be stuck before the step of cutting the wafer 41 described later; in this embodiment, however, it is stuck before the openings are formed in the wafer 41. This is because when a surface to which it is stuck is flat, the dicing tape 42 can be easily stuck.

As illustrated in FIG. 15 and FIG. 16, subsequently, the mask 43 is formed over the main surface 41a of the wafer 41. In the mask 43, multiple openings 43a are regularly arranged and in this embodiment, they are arranged in a matrix pattern as illustrated in FIG. 15. The mask 43 is formed over the main surface 41a of the wafer 41 using, for example, photoresist.

As illustrated in FIG. 17, subsequently, the openings 4d in the wafer 41 and the openings in the second adhesive 11 are formed. At this step, the openings are formed by removing portions of the wafer 41 and second adhesive 11 corresponding to them from the main surface 41a side of the wafer 41, that is, the side where the mask 43 is formed. To remove the portions, various known methods can be used. In this embodiment, for example, a corroding technique designated as wet etching is used. In wet etching, unnecessary portions are removed by immersing unprocessed portions in etchant and supplying etchant through the openings 43a (Refer to FIG. 16) in the mask 43. Aside therefrom, the openings can also be formed using a dry etching technique utilizing reactive etching gas, a sand blast technique in which abrasive is sprayed, or the like.

As illustrated in FIG. 18, subsequently, the wafer 41 and the second adhesive 11 are cleaned and then dried. At this step, the mask 43 illustrated in FIG. 17 is removed and then rinsing, cleaning fluid, or the like is used to completely remove, especially, residues left after the unwanted parts remaining in the openings 4d are removed.

As illustrated in FIG. 19, subsequently, a protective sheet 12 is stuck over the main surface 41a of the wafer 41. At this step, the protective sheet 12 is so stuck that all the openings 4d are covered therewith. As a result, the interior of the openings 4d is sealed and protected against falling contaminations and the like.

As illustrated in FIG. 20, subsequently, the wafer 41 and the second adhesive 11 are cut along dicing lines and segmented into the individual base materials 4.

As illustrated in FIG. 21, subsequently, each segmented base material 4 is picked up and transported. It may be transported to, for example, a container for temporarily storing multiple base materials 4. However, when a base material 4 is detached from the dicing tape 42, its opening 4d is exposed from the back surface 4b side of the base material 4. From the viewpoint of contamination prevention, therefore, it is desirable to take the following measure: a base material 4 picked up is directly moved to above the main surface 3a of a semiconductor chip 3 illustrated in FIG. 11 and mounted without interruption. (This method is designated as direct pickup.)

The following base material 4 is obtained by the above steps: a base material in which the protective sheet 12 covering its opening 4d is stuck beforehand to its main surface 4a and the second adhesive 11 is stuck beforehand to its back surface 4b. As mentioned above, the protective sheet 12 covering the entire opening 4d in each base material 4 is stuck beforehand to its main surface 4a and this base material 4 is mounted. As a result, the light receiving area 3d of the semiconductor chip 3 can be shut off from outside and thus the light receiving area 3d can be protected against a falling contamination and the like during the manufacturing process.

The above die bonding step uses a method of applying the paste first adhesive 9 to each tab 1 as the base and pressing a semiconductor chip 3 against the first adhesive 9 to bond it. At this step, however, it is desirable that the second adhesive 11 should be stuck beforehand to each base material 4. The reasons for this are as follows:

A first reason will be described. When the second adhesive 11 is stuck beforehand to each base material 4, the following can be implemented by using, for example, the method described with reference to FIG. 12 to FIG. 21: the multiple dots of second adhesive 11 respectively stuck to multiple base materials 4 can be formed in a lump. When the multiple dots of second adhesive 11 are formed in a lump, the thickness of each dot of second adhesive 11 can be easily made substantially constant.

When the dots of second adhesive 11 are substantially constant in thickness, it is possible to make substantially constant the profiles of the main surfaces 4a of the base materials 4 in the respective product formation regions 15a. When the main surfaces 4a of the base materials 4 are constant in profile, it is possible to make even pressure applied to the main surface 4a of each of the base materials 4 at the sealing step described later. The effect of the equalization of pressure applied to the main surface 4a of each base material 4 will be described in detail when the sealing step is described.

The second adhesive 11 may be formed by applying the above-mentioned hot-melt and thermosetting adhesive and then drying it or the above-mentioned DAF having an adhesion layer on both sides may be used instead. The DAF is a film-like double-sided adhesive tape and is comprised of a base material (core material) and an adhesion layer formed on the surfaces of the base material. The DAF can be formed with even thickness unlike the paste adhesive used for the first adhesive 9.

In this embodiment, paste adhesive is used for the first adhesive 9. The factors determining the profile of the second main surface of the base material 4 includes the thickness of the first adhesive 9. From the viewpoint of making the profiles uniform, therefore, it is desirable to use film-like adhesive, such as DAF, also for the first adhesive 9.

However, since the paste first adhesive 9 described in relation to the above die bonding step is commonly used as an adhesive material for semiconductor chips, it can be inexpensively procured. With respect to the thickness of the first adhesive 9, a certain degree of uniformity can be ensured by taking the following measure: using a pressing jig, it is pressed from the main surface 3a side of a semiconductor chip 3 when the semiconductor chip 3 is mounted as mentioned above.

Meanwhile, the second adhesive 11 is arranged over the light receiving area 3d of each semiconductor chip 3. The base material 4 is mounted over the second adhesive 11 and the base material 4 is a frame-like structure (frame body) and thus is more easily damaged than the semiconductor chip 3 is. Therefore, in cases where paste adhesive is used for the second adhesive 11 when the base material 4 is mounted, pressing force smaller than pressing force applied when the semiconductor chip 3 is mounted can only be applied. As a result, there is a possibility that the thickness of the second adhesive 11 may greatly vary.

That is, the following measure is taken to achieve both reduction of the manufacturing cost of the QFN 10 and enhancement of its reliability: paste adhesive is used for the first adhesive 9, which makes it possible to make its influence on the height of the main surface 4a of the base material 4 relatively slight; and since the second adhesive 11 has especially great influence on the height of the main surface 4a of the base material 4, the second adhesive 11 is stuck beforehand.

A second reason will be described. The base material 4 is mounted over the main surface 3a of the semiconductor chip 3. Therefore, when this step is carried out prior to the wire bonding step described later, there is a possibility that the second adhesive 11 can cover the pads 3e depending on the positional accuracy of a step of applying paste adhesive or the viscosity of paste. To reduce the risk of the main surface 3a of the semiconductor chip 3 being damaged, it is desirable to take the following measure: the number of steps at which work is conducted on the main surface 3a before the main surface 3a is protected by the base material 4 is reduced as much as possible. Sticking the second adhesive 11 beforehand makes is possible to prevent the second adhesive 11 from covering the pads 3e. Further, since a step of applying paste adhesive can be omitted, the possibility of the main surface 3a of the semiconductor chip 3 being damaged can be reduced.

Subsequently, the base material 4 with the second adhesive 11 stuck to its back surface 4b is mounted over the main surface 3a of the semiconductor chip 3 through the second adhesive 11. The base material is so arranged that its back surface 4b is opposed to the main surface 3a of the semiconductor chip 3. At this time, the semiconductor chip 3 is heated (or preheated). Thus the heat from the semiconductor chip 3 is transmitted to the second adhesive 11 to soften the second adhesive 11 and as a result, the base material 4 and the semiconductor chip 3 are bonded to each other.

As illustrated in FIG. 11, it is desirable that the thickness of the second adhesive 11 should be smaller than the thickness of the first adhesive 9. The reason for this will be described below. Since the second adhesive 11 has a hot-melt property, it is lower in rigidity (softer) than the first adhesive 9 as cured thermosetting resin. When clamped at the sealing step described later, therefore, the second adhesive 11 is more prone to be deformed than the first adhesive 9. In this embodiment, consequently, the second adhesive 11 can be made less prone to be deformed by making the thickness of the second adhesive 11 smaller than the thickness of the first adhesive 9. Thus deformation of the second adhesive 11 can be suppressed at the sealing step.

At this step, the base material is so mounted that the following is implemented at the wire bonding step described later: the level of the main surface 4a of the base material 4 is higher than the levels of the wires 5 (Refer to FIG. 3) respectively electrically coupling the pads 3e and the leads 2 with each other. For example, the thickness of the base material 4 is larger than the loop height of each wire 5. This is intended to reliably seal the wires 5 (Refer to FIG. 3) and expose part of the side surfaces 4c of the base material 4 from the sealing body 6 at the sealing step. To arrange them with this positional relation in this embodiment, the thickness of the base material 4 is made larger than the distance from the upper surface of each pad 3e to the top of each wire 5 in the direction of thickness as illustrated in FIG. 3.

As the result of this step, the following is implemented: the light receiving area 3d formed in the main surface 3a of the semiconductor chip 3 is completely covered with and protected by the protective sheet 12 stuck to the base material 4 and the main surface 4a through the second adhesive 11.

Figure 22:
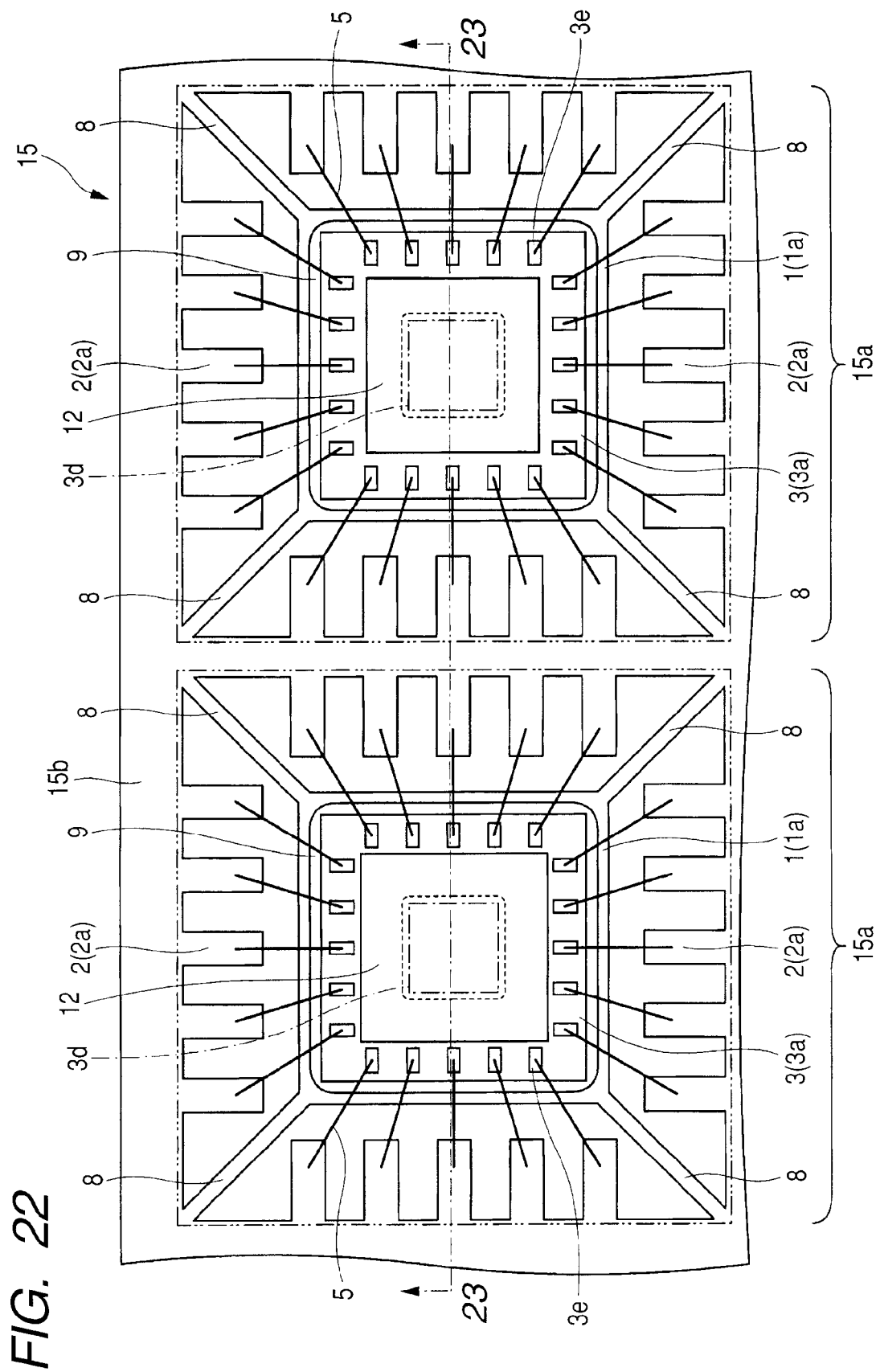
FIG. 22 is an enlarged plan view illustrating how the pads and leads illustrated in FIG. 10 are respectively electrically coupled together through wires.
Figure 23:
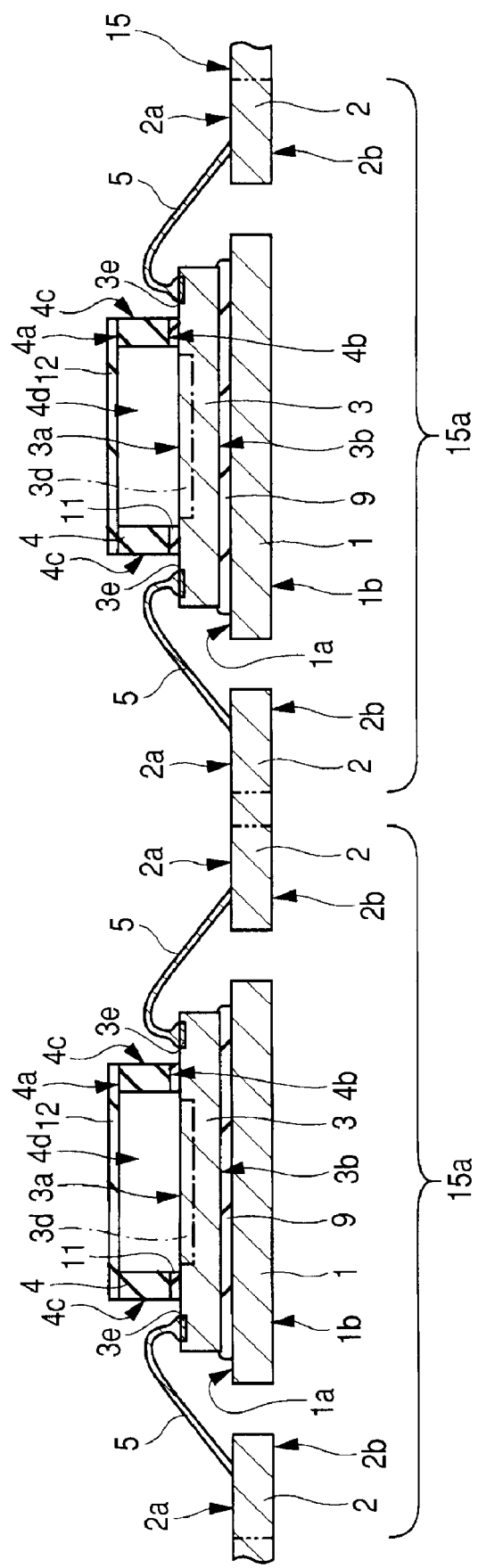
FIG. 23 is an enlarged sectional view taken along line C-C of FIG. 22.

As illustrated in FIG. 22 and FIG. 23, subsequently, the pads 3e of each semiconductor chip 3 and the corresponding leads (electrode areas, internal coupling areas) 2 are respectively electrically coupled with each other through the wires 5 (wire bonding step). FIG. 22 is an enlarged plan view illustrating how the pads and leads illustrated in FIG. 10 are respectively electrically coupled with each other through wires; and FIG. 23 is an enlarged sectional view taken along line C-C of FIG. 22.

In this embodiment, ultrasonic bonding and thermocompression bonding are used together to bond the wires 5. At this time, so-called normal bonding is used and one end of a wire 5 is connected to a pad 3e of the semiconductor chip 3 and then the other end side of the wire 5 is connected to a lead 2 of the lead frame 15. As illustrated in FIG. 23, a ball is joined over each pad 3e of the semiconductor chip 3 by the load of a capillary (not shown). The ball is formed by discharging the one end of the wire 5 protruded from the tip of the capillary. Forming this ball at the one end of the wire 5 beforehand makes it possible to further enhance the strength of bonding between each pad 3e as the 1st bond and the wire 5.

In normal bonding, the loop of each wire 5 is formed by taking the following procedure: a pad 3e as the 1st bond and one end of the wire 5 are joined with each other and then the capillary moves in orbit and guides the wire 5 to a lead 2 of the lead frame 15 as the 2nd bond. At this time, the loop of the wire 5 is so formed that the height of its top is lower than the height of the main surface 4a of the base material 4. As mentioned above, this is intended to reliably seal the wires 5 and expose part of the side surfaces 4c of the base material 4 from the sealing body 6 at the sealing step described later.

In this embodiment, this step (wire bonding step) is carried out after the above-mentioned base material mounting step. In other words, the base material mounting step is carried out before the wire bonding step. In yet other words, the wire bonding step is carried out with the base material 4 already mounted. The reason for this is as follows:

If the order of the steps in this embodiment is changed and the wire bonding step is carried out before the base material mounting step, the base material mounting step is carried out with the wires 5 bonded to the pads 3e. When the base material 4 is mounted, for this reason, there is a possibility that the base material 4 or a jig, such as a collet, loaded therewith may be brought into contact with a wire 5. In this case, the joint of the wire 5 is detached from the pad 3e and this can lead to faulty electrical continuity. If a wire 5, though not detached from a pad 3e, is deformed and it is brought into contact with an adjacent wire 5, there is a possibility of short-circuiting. Faulty electrical continuity and short-circuiting contribute to degradation in the reliability of the QFN 10.

To cope with this, in this embodiment, the wire bonding step is carried out with the base material 4 already mounted. This makes it possible to prevent faulty electrical continuity and short-circuiting that cause degradation in reliability.

Figure 24:
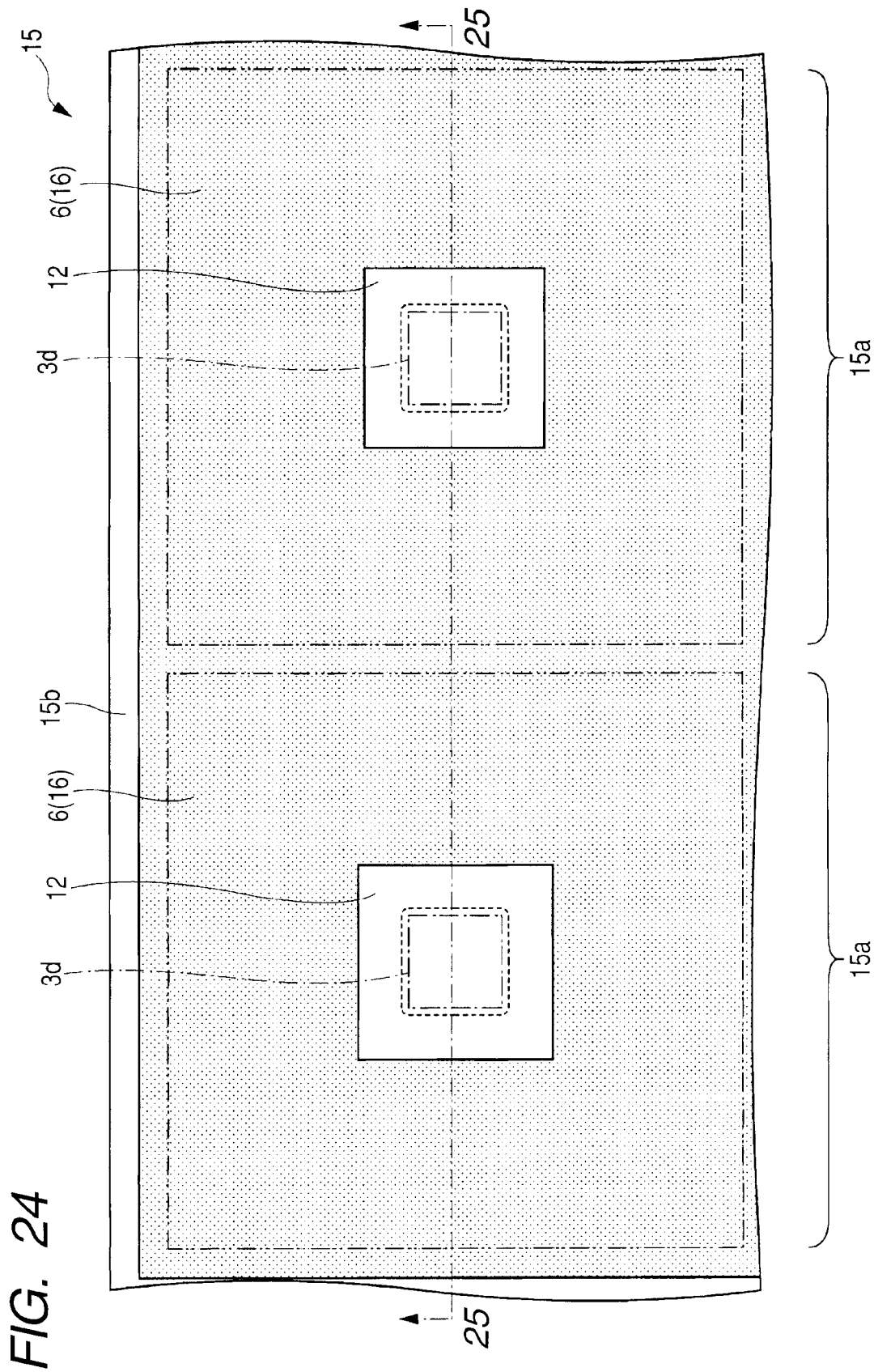
FIG. 24 is an enlarged plan view illustrating how the semiconductor chips, base materials, and wires illustrated in FIG. 22 are sealed with resin to form a sealing body.
Figure 25:
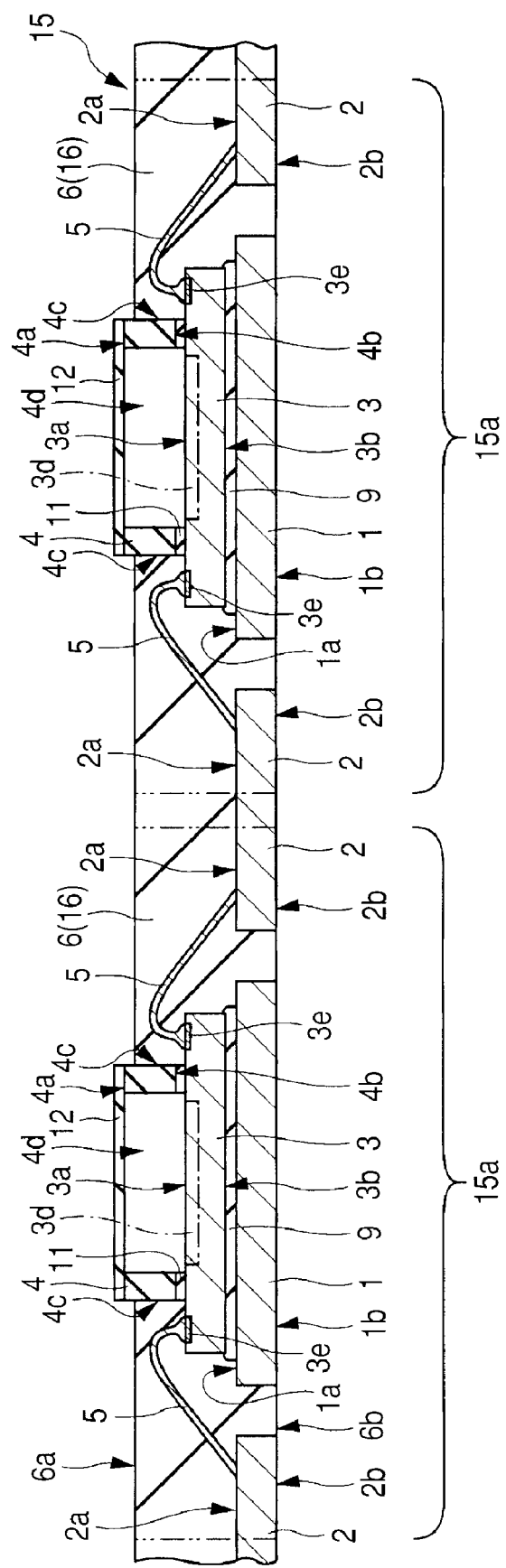
FIG. 25 is an enlarged sectional view taken along line C-C of FIG. 24.

As illustrated in FIG. 24 and FIG. 25, subsequently, the semiconductor chips 3, base materials 4, and wires 5 are sealed with resin to form a sealing body (blanket sealing body) (sealing step). At this time, they are sealed so that part of the side surfaces 4c of each base material 4 and the main surface 4a of the base material 4 are exposed. FIG. 24 is an enlarged plan view illustrating how the semiconductor chips, base materials, and wires illustrated in FIG. 22 are sealed with resin to form a sealing body; and FIG. 25 is an enlarged sectional view taken along line C-C of FIG. 24.

In this embodiment, so-called batch molding method (batch transfer molding method) is used to seal multiple product formation regions 15a in a lump to form a blanket sealing body 16, which is divided into individual QFNs 10 at the segmentation step described later. This manufacturing method is designated as MAP (Mold Array Process). The MAP makes it possible to seal a large number of product formation regions 15a arranged in a matrix pattern in one sealing step. Therefore, it enhances production efficiency and is desirable from the viewpoint of manufacturing cost reduction. By dividing the blanket sealing body 16 illustrated in FIG. 24 and FIG. 25 into the individual product formation regions 15a, the sealing body 6 illustrated in FIG. 1 to FIG. 4 is obtained.

Detailed description will be given to steps for forming the blanket sealing body 16 with reference to FIG. 26 to FIG. 36.

Figure 26:
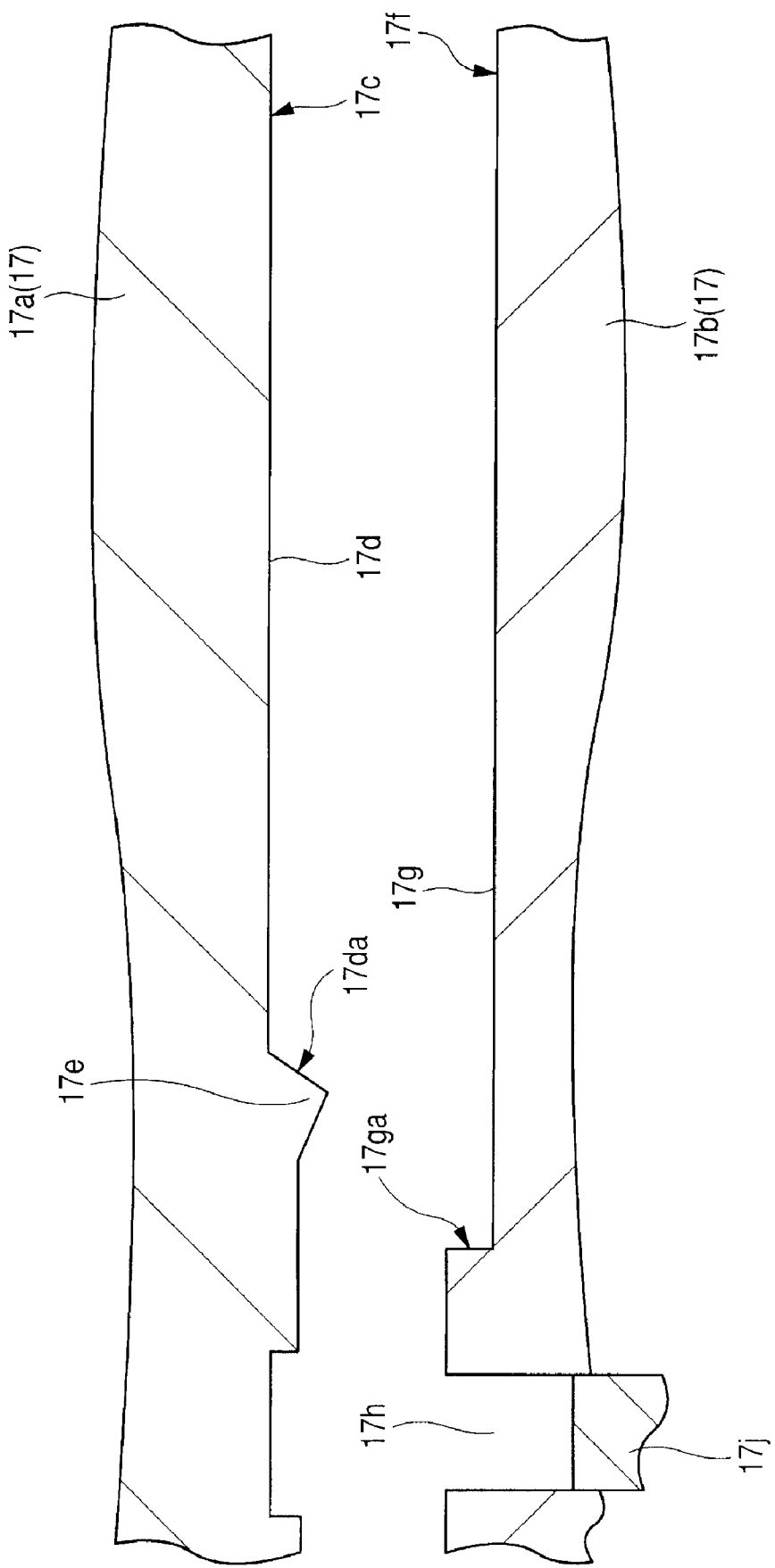
FIG. 26 is a substantial part enlarged sectional view illustrating part of a molding die used to form the sealing body of a semiconductor device in an embodiment of the invention in an enlarged manner.

As illustrated in FIG. 26, first, a molding die 17 having an upper die 17a and a lower die 17b opposite the upper die 17a is prepared (molding die preparation step). FIG. 26 is an enlarged sectional view illustrating part of the molding die used to form the sealing body of a semiconductor device in this embodiment in an enlarged manner.

The upper die 17a includes: an upper die surface 17c; a cavity 17d formed in the upper die surface 17c; a gate portion 17e formed in the upper die 17a so that it communicates with the cavity 17d and used to supply resin; and an air vent portion (not shown) formed in the upper die 17a in a position opposite the gate portion 17e with the cavity 17d in-between. The side surface 17*da* of the cavity 17*d* is inclined from outside to inside. This enhances the mold release characteristics related to ease of taking a lead frame 15 (Refer to FIG. 25) with the blanket sealing body 16 (Refer to FIG. 25) formed thereon out of the molding die 17.

Meanwhile, the lower die 17*b* includes: a lower die surface 17*f* opposite the upper die surface 17*c* of the upper die 17*a*. The lead frame mounting region of the lower die 17*b* has a stepped portion 17*g* and a lead frame 15 (Refer to FIG. 25) is aligned by the side surface 17*ga* of this stepped portion 17*g*.

Further, the molding die 17 has a pot portion 17*h* formed when the upper die 17*a* and the lower die 17*b* are mated with each other. The pot portion 17*h* communicates with the cavity 17*d* through a resin flow path such as the gate portion 17*e*. In the pot portion 17*h*, there is arranged a plunger 17*j* for filling resin for the formation of the blanket sealing body 16 (Refer to FIG. 25).

Figure 27:
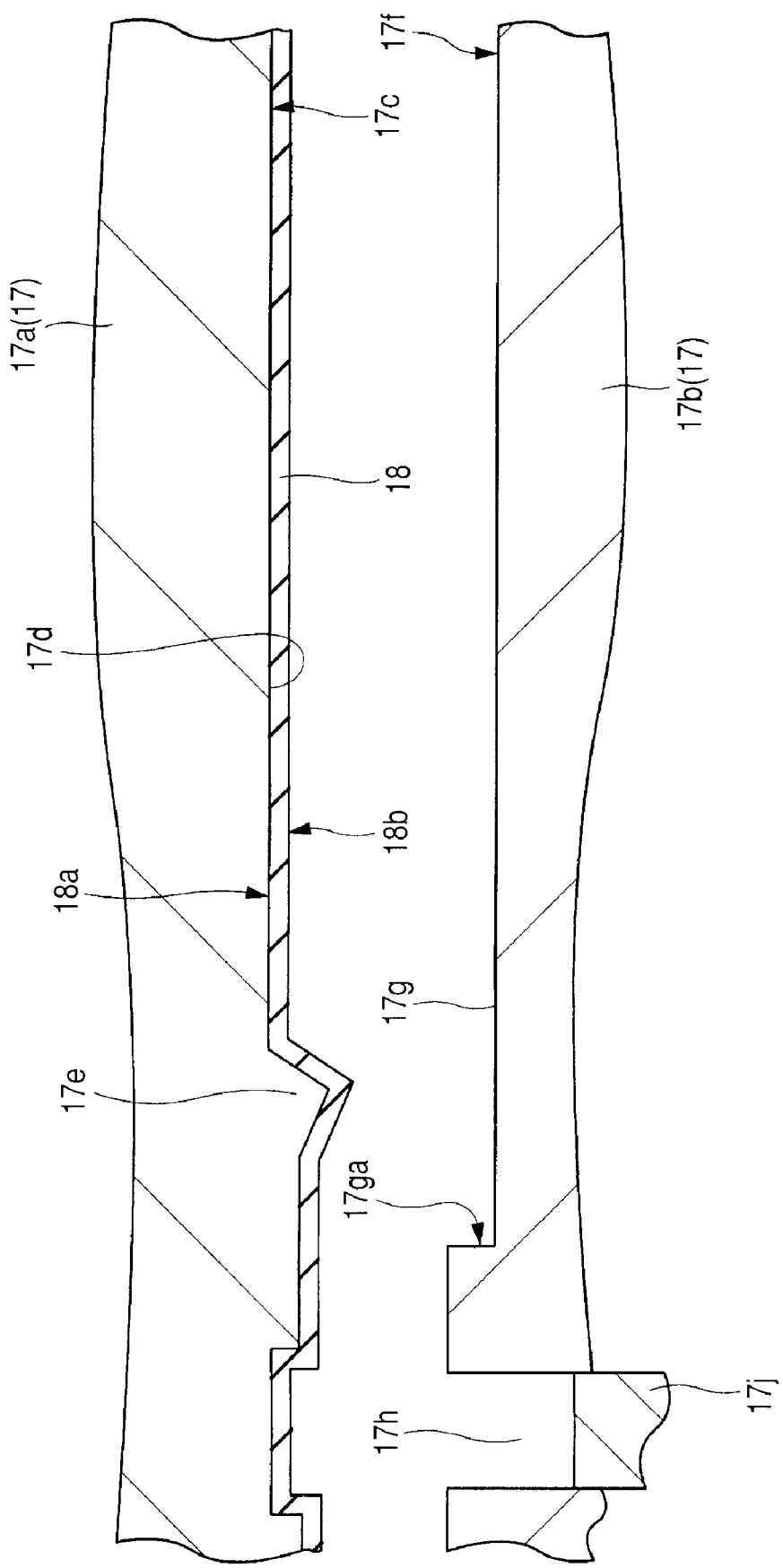
FIG. 27 is a substantial part enlarged sectional view illustrating how a film is arranged between the upper die and lower die illustrated in FIG. 26.

As illustrated in FIG. 27, subsequently, a film (upper die surface coating film) 18 is arranged between the upper die 17*a* and the lower die 17*b* (film arrangement step). FIG. 27 is a substantial part enlarged sectional view illustrating how the film is arranged between the upper die and lower die illustrated in FIG. 26.

The film 18 is so arranged that it covers the upper die surface 17*c* of the upper die 17*a*. It is desirable that the film 18 should have an area larger than that of the upper die surface 17*c* of the upper die 17*a* and be so arranged that it covers the entire upper die surface 17*c*. It is especially desirable that the film 18 has such a size that it covers at least the region extended from the area where the pot portion 17*h* is arranged to the area where the air vent portion is arranged. This is intended to prevent resin from flowing into between the upper die surface 17*c* of the upper die 17*a* and the film 18 at the resin supply step described later.

As illustrated in FIG. 27, it is desirable that the film 18 should be arranged in accordance with the projections and depressions in the upper die surface 17*c* of the upper die 17*a*. This is intended to prevent a gap from being produced between the upper die surface 17*c* of the upper die 17*a* and the film 18. An example of methods for arranging the film 18 in accordance with the projections and depressions in the upper die surface 17*c* as illustrated in FIG. 27 is as follows: air inlet ports extended to the upper die surface 17*c* are formed in the upper die 17*a* in multiple positions; and air is sucked through the air inlet ports to attract the film. In this case, however, there is a possibility that in areas where no air inlet port is formed, the film 18 is loosened by its own weight and a gap is produced between it and the upper die surface 17*c* of the upper die 17*a*.

It is desirable to take the following measure from the viewpoint of arranging the film 18 without producing a gap between it and the upper die surface 17*c* of the upper die 17*a*: an adhesive layer is formed on the upper surface 18*a* of the film 18 and the film is thereby brought into tight contact with the upper die surface 17*c*. However, the adhesive layer only has to have adhesive force to the extent that the upper surface 18*a* and the upper die surface 17*c* are kept in tight contact with each other until the following takes place: until the under surface 18*b* side of the film 18 illustrated in FIG. 27 is abutted against the upper surface 12*a* of the protective sheet 12 (Refer to FIG. 25) at the clamp step described later. In consideration of ease of the rearrangement of the film 18, lower adhesive force is better unless it does not become lower than the adhesive force at such a level that the above tight contact can be maintained.

The thickness, hardness, and other properties of the film 18 will be described later when the clamp step is described.

Figure 28:
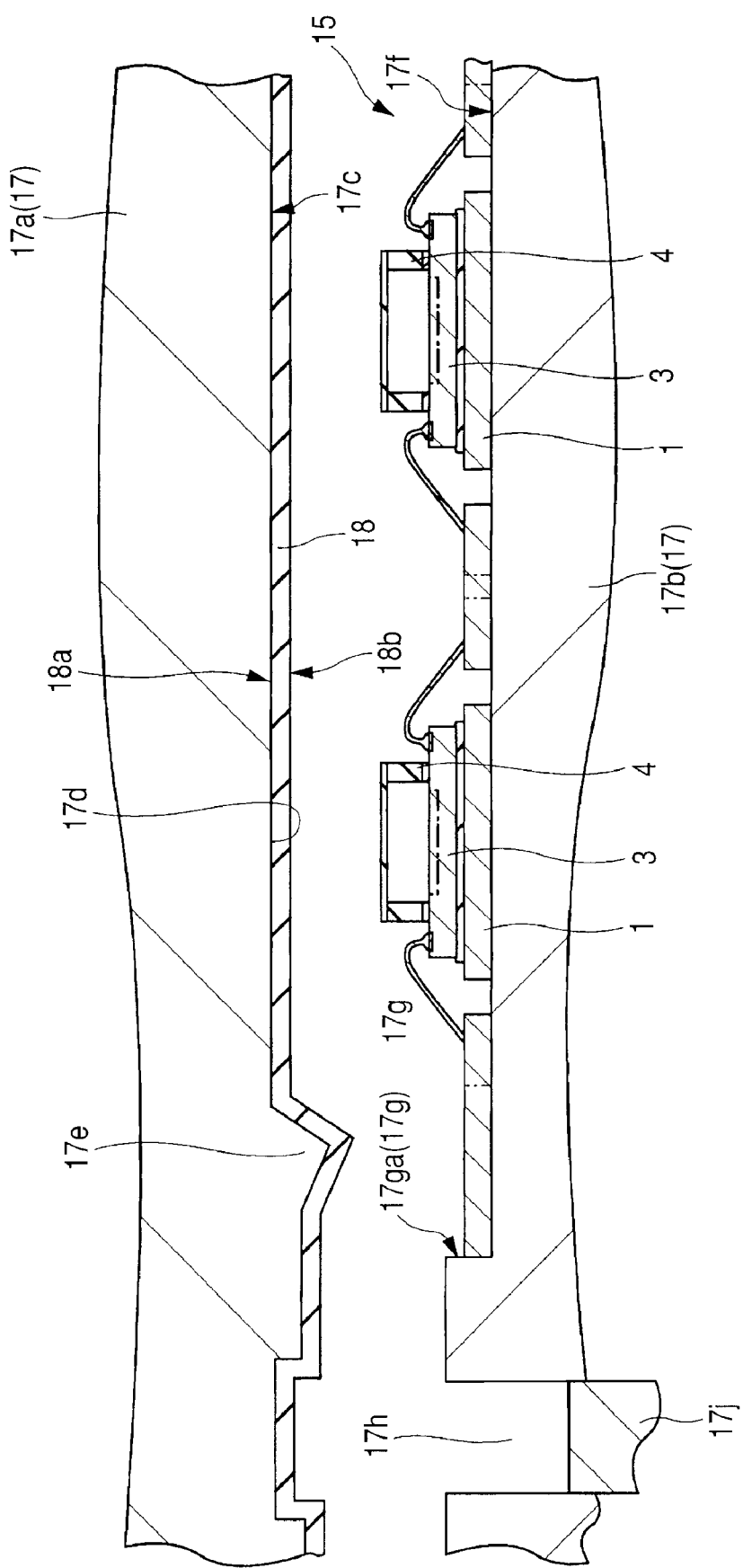
FIG. 28 is a substantial part enlarged sectional view illustrating how the lead frame illustrated in FIG. 25 is arranged between the film and lower die illustrated in FIG. 27.

As illustrated in FIG. 28, subsequently, the lead frame 15 mounted with semiconductor chips 3 and base materials 4 is arranged between the film 18 and the lower die 17*b* (lead frame arrangement step). FIG. 28 is a substantial part enlarged sectional view illustrating how the lead frame illustrated in FIG. 25 is arranged between the film and lower die illustrated in FIG. 27.

At this step, the lead frame 15 is aligned and arranged in the molding die 17 so that the following is implemented: the under surface of the lead frame 15 is opposed to the lower die surface 17*f* of the lower die 17*b* and the semiconductor chips 3 are positioned in the cavity 17*d* in the upper die 17*a*. (In other words, the lead frame is so arranged that the multiple semiconductor chips 3 are arranged in the one cavity 17*d*.) This alignment can be facilitated by aligning an end of the lead frame 15 with the side surface 17*ga* of the stepped portion 17*g* of the lower die 17*b*.

The lead frame arrangement step and the above-mentioned film arrangement step may be counterchanged in order. However, the wires 5 (Refer to FIG. 25) are exposed at this point of time. Therefore, it is desirable to carry out the lead frame arrangement step after the film arrangement step from the viewpoint of avoiding a risk of the film 18 being brought into contact with a wire 5 when it is arranged.

Figure 29:
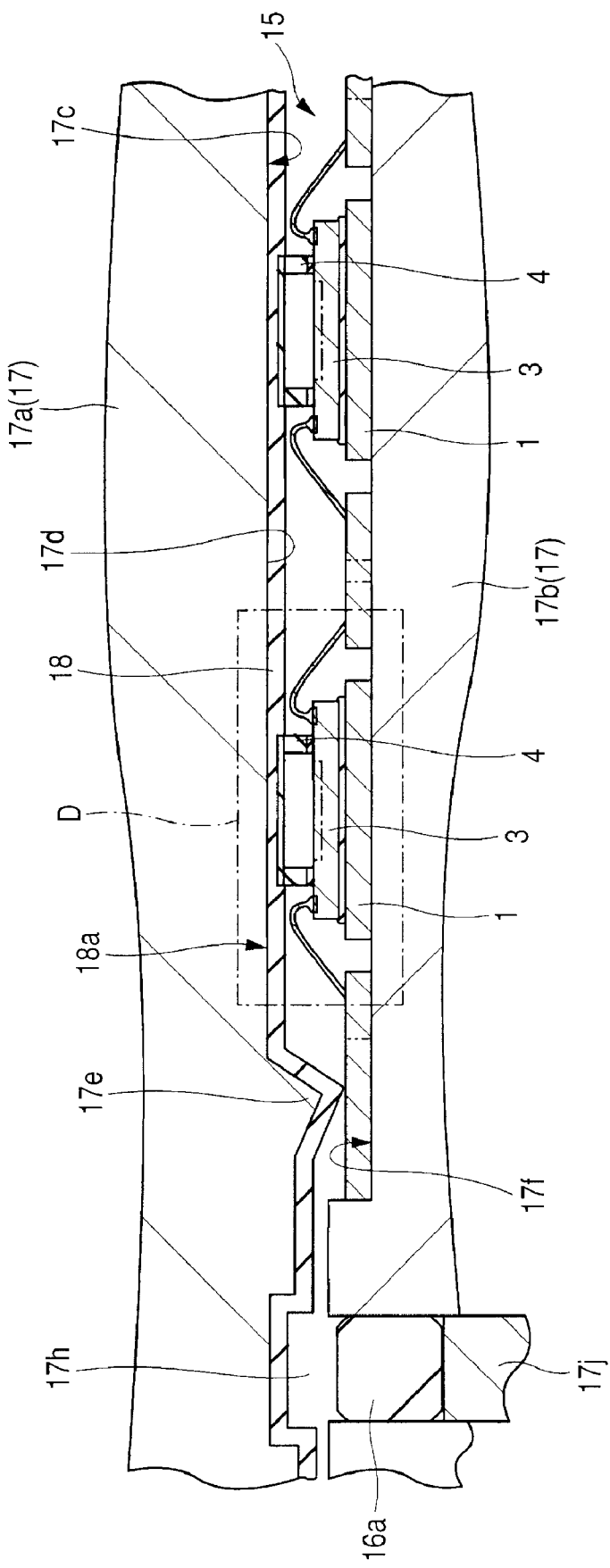
FIG. 29 is a substantial part enlarged sectional view illustrating how the upper die and lower die illustrated in FIG. 28 are clamped.
Figure 30:
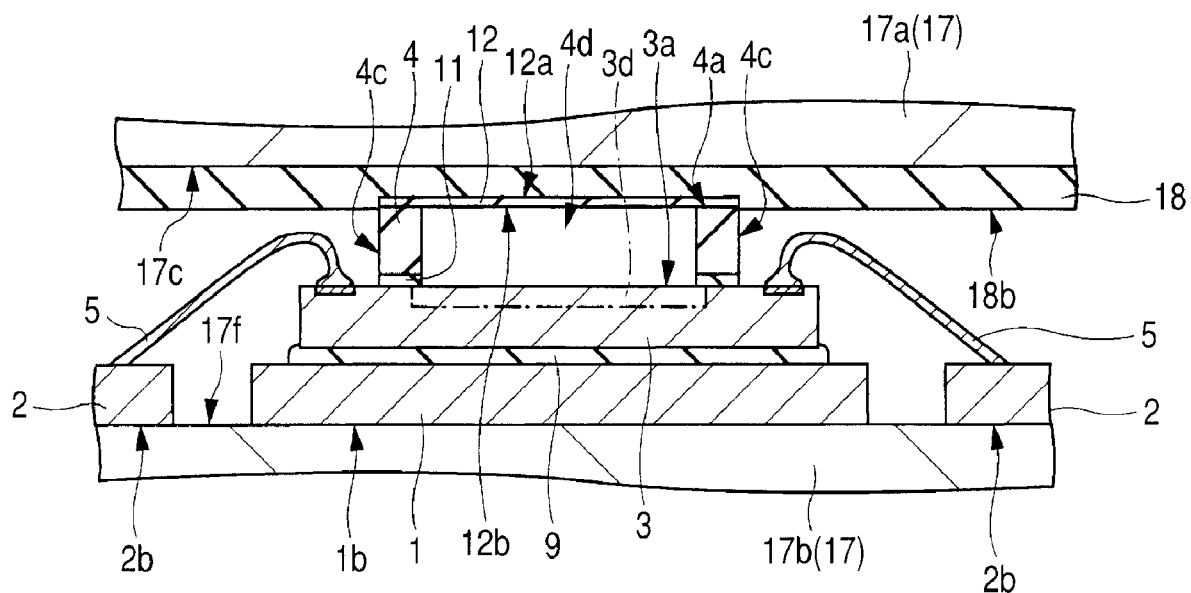
FIG. 30 is a substantial part enlarged sectional view illustrating D part illustrated in FIG. 29 in a further enlarged manner.
Figure 31:
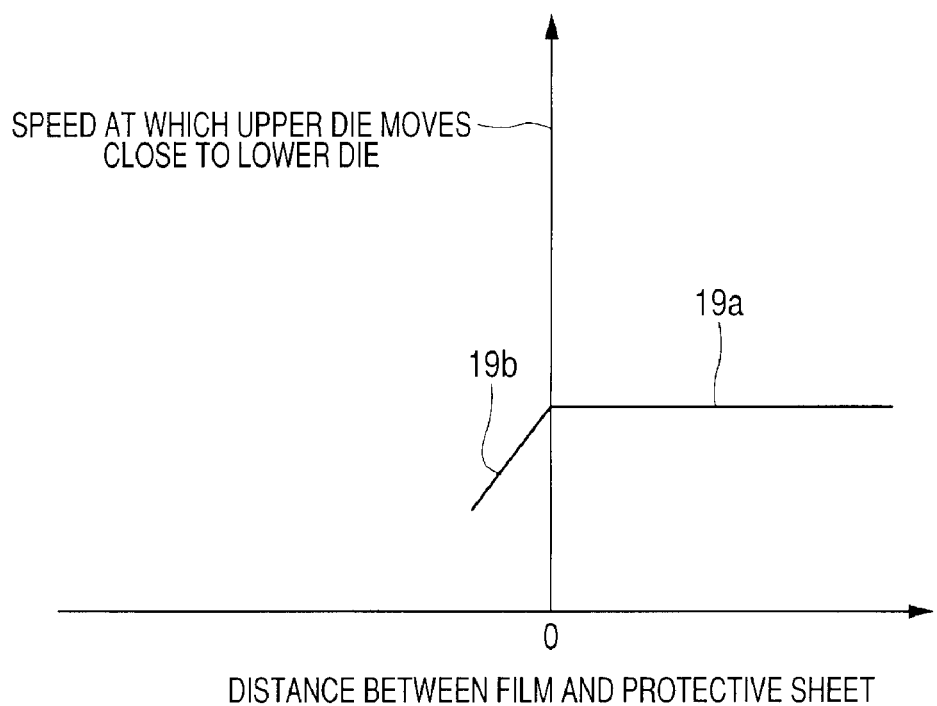
FIG. 31 is an explanatory drawing illustrating the relation between the distance between film and base material and the speed at which the upper die approaches the lower die at the clamp step.

As illustrated in FIG. 29 and FIG. 30, subsequently, the upper die 17*a* and the lower die 17*b* are clamped to cause part of each base material 4 to bite into the film 18 (clamp step). FIG. 29 is a substantial part enlarged sectional view illustrating how the upper die and lower die illustrated in FIG. 28 are clamped; and FIG. 30 is a substantial part enlarged sectional view illustrating D part illustrated in FIG. 29 in a further enlarged manner. FIG. 31 is an explanatory drawing indicating the relation between the distance between film and protective sheet and speed at which the upper die and the lower die are brought close to each other at the clamp step. In FIG. 31, the vertical axis indicates speed at which the upper die and the lower die are brought close to each other and the speed becomes higher as it goes upward along the vertical axis. The horizontal axis indicates the distance between the film and each base material and the distance becomes longer as it goes to the left along the horizontal axis. At the point where the horizontal axis takes zero (the point of intersection with the vertical axis), the film and each protective sheet are abutted against each other.

At this step, the distance between the upper die 17*a* and the lower die 17*b* is reduced to clamp the upper die 17*a* and the lower die 17*b*. The film 18 is comprised of a resin material, such as polyimide, softer (lower in hardness) than the base material 4. The protective sheet 12 stuck over the main surface 4*a* of each base material 4 is a resin film having an adhesive layer on its under surface 12*b*, or a surface abutted against, for example, the base material 4. The protective sheet is comprised of, for example, polyimide. Therefore, the protective sheet 12 is also softer (lower in hardness) than the base material 4. For this reason, the following takes place when after the abutment between the under surface 18*b* of the film 18 and the upper surface 12*a* of each protective sheet 12, the distance between the upper die 17*a* and the lower die 17*b* is further reduced: the under surface 18*b* side of the film 18 and the protective sheet 12 are deformed as illustrated in FIG. 30 and as a result, the entire protective sheet 12 and part of the base material 4 bite into the film 18.

It is difficult to completely bring the film 18 and the protective sheet 12 into tight contact with each other just by abutting the under surface 18*b* of the film 18 and the upper surface 12*a* of the protective sheet 12 against each other. A slight gap is prone to be produced, especially, at the outer edge portion of the base material 4. If the blanket sealing body formation step described later is carried out with this slight gap produced, the sealing resin will flow in through this gap and to over the upper surface 12a of the protective sheet 12 and resin flash will be formed.

If this resin flash is formed, it will drop over the light receiving area 3d (Refer to FIG. 3) of QFN 10 (Refer to FIG. 3) when the protective sheet 12 is stripped off. That is, each light receiving area 3d can be protected during the manufacturing process by covering it with the protective sheet 12. However, if resin flash is formed over the protective sheet 12, that will eventually contribute to degradation in the reliability of the QFN 10 as a photosensor semiconductor device. Therefore, when the protective sheet 12 is stripped off after the QFN 10 is mounted over a mounting board, for example, it is required to remove resin flash with the QFN mounted over the mounting board. If resin flash sticking to a main surface 4a is minute and this adhesion is overlooked, that will contribute degradation in the reliability of the QFN 10. Especially, in a photosensor that focuses and uses light in a specific wavelength band as laser light like optical pickup devices, serious degradation in reliability will be caused if the laser light is intercepted or scattered.

In this embodiment, consequently, the adhesion between the film 18 and each protective sheet 12 is enhanced by pushing it to the extent that the film 18 bites into part of each base material 4. In this embodiment, further, it is caused to bite utilizing clamp force for reducing the distance between the upper die 17a and the lower die 17b. Therefore, especially high clamp force is exerted on the outer edge portion of the main surface 4a of each base material 4. As a result, at the outer edge portion of the main surface 4a of the base material 4, the film 18 and the protective sheet 12 are completely brought into tight contact with each other. Owing to the same effect, the protective sheet 12 and the main surface 4a of the base material 4 are also completely brought into tight contact with each other. At the blanket sealing body formation step described later, therefore, sealing resin can be reliably prevented from flowing to the upper surface 12a side of the protective sheet 12 and thus the production of resin flash can be prevented. That is, the reliability of the QFN 10 (Refer to FIG. 3) can be enhanced.

Description will be given to a semiconductor device obtained by causing only the protective sheet 12 to bite into the film 18 at this step. In this case, the side surfaces 4c of each base material 4 would not be exposed from the sealing body 6 at all and only the side surfaces of the protective sheet 12 would be exposed. In cases where resin flash is formed on a side surface of the protective sheet 12 in such a structure, there is the following concern: concern that when the protective sheet 12 is stripped off, the resin flash may drop and stick over the main surface 4a of the base material 4. To prevent this, it is desirable to expose also part of the second side surfaces of each base material 4 from the sealing body 6.

In this embodiment, the film 18 is caused to bite into part of each base material 4. As a result, the under surface 12b of the protective sheet 12 and the main surface 4a of the base material 4 can also be brought into tight contact with each other. Therefore, the ingress of resin into therebetween can be prevented. That is, the production of resin flash can be prevented.

At this step, part of each base material 4 is caused to bite into the film 18 for the prevention of the production of resin flash. Therefore, the degree of biting may be as small as several μm to several tens of μm as long as the outer edge portion of each protective sheet 12 is reliably in tight contact with the film 18. For this reason, the film 18 has a thickness of, for example, 50 μm to 100 μm so that each base material 4 can be caused to bite thereinto.

To also cause part of each base material 4 to bite into the film 18, it is especially desirable that a material that is harder (that is, higher in hardness) than the film 18 should be used for the protective sheet 12. As the result of making the protective sheet 12 harder than the film 18, the film 18 is deformed by pressure it receives from the protective sheet 12 at the clamp step. Then it goes round to the side surface 4c side of the base material 4. Therefore, part of the base material 4 can also be caused to bite into the film 18.

The strength of the protective sheet 12 can be enhanced by increasing the hardness of the protective sheet 12. When the protective sheet 12 is stripped off, the stripping work can be facilitated. When part of the side surfaces 4c of each base material 4 is exposed from the sealing body 6 as illustrated in FIG. 25, the protective sheet 12 is completely exposed from the sealing body 6. That is, the ends of the protective sheet 12 on the under surface 12b side are exposed from the sealing body 6; therefore, it can be easily stripped off.

If the protective sheet 12 does not cover the entire base material 4, there would be produced a step between an area where the protective sheet 12 is arranged and an area where it is not arranged over the main surface 4a of each base material 4. If this step is produced, a wrinkle can be formed when the film 18 is caused to bite at this step. Therefore, it is desirable that each protective sheet 12 should cover the entire main surface 4a of the base material 4. From this viewpoint, it is desirable that the outer dimensions of the under surface 2b of the protective sheet 12 should be equal to or larger than the outer dimensions of the main surface 4a of the base material 4. When the outer dimensions of the under surface 12b are made equal to or larger than the outer dimensions of the main surface 4a, the entire main surface 4a can be covered with the protective sheet 12.

The equal outer dimensions cited here do not mean exactly identical outer dimensions. The surfaces only have to have dimensions identical to the extent that a step causing the production of the above-mentioned wrinkle is not formed at the clamp step and slightly different dimensions are not excluded because of constraints of machining accuracy and the like.

However, when an end of a protective sheet 12 having outer dimensions larger than the outer dimensions of the base material 4 is arranged above, for example, an area where a wire 5 is arranged, a problem may arise. If the end of the protective sheet 12 is bent downward during the clamp step, it may be brought into contact with the wire 5. If the blanket sealing body formation step is carried out in this state, there is concern that the wire 5 is exposed. Therefore, it is especially desirable that the outer dimensions of the under surface 12b of the protective sheet 12 should be equal to the outer dimensions of the main surface 4a.

With respect to the comparison of thickness between the film 18 and the protective sheet 12, it is desirable to take the following measure from the viewpoint of reliably causing the film 18 to bite into each base material 4: the film 18 is made thicker than the protective sheet 12.

It is desirable that the film 18 should be softer (lower in hardness) and more prone to be deformed than the members (first adhesive 9, semiconductor chip 3, second adhesive 11, base material 4) mounted over each tab 1. This is intended to reliably bring the outer edge portion of each protective sheet 12 into tight contact with the film 18 by deforming mainly the film 18 when clamp force is applied.

Among the members mounted over each tab 1 in this embodiment, the member softest next to the protective sheet 12 that is softest is the second adhesive 11. It is desirable to use a member softer than the second adhesive 11 for the film 18.

To cause part of each base material 4 to bite into the film 18, the following measure is taken at this step: after the under surface 18b of the film 18 and the upper surface 12a of each protective sheet 12 are abutted against each other, the distance between the upper die 17a and the lower die 17b are further reduced. For this reason, a higher load is applied to each base material 4 than in cases where it and the protective sheet are just abutted against. However, since the base material 4 has the opening 4d as mentioned above, there is concern that it may be broken if a high load is abruptly applied.

In this embodiment, consequently, it is desirable to perform the clamp operation in two stages as described below. Until the under surface 18b of the film 18 and the upper surface 12a of each protective sheet 12 are abutted against each other after the clamp operation is started, the following measure is taken: the distance between the upper die 17a and the lower die 17b is reduced at a first speed 19a (Refer to FIG. 31). After the under surface 18b and the upper surface 12a are abutted against each other, the distance between the upper die 17a and the lower die 17b is reduced at a second speed 19b lower than the first speed 19a (Refer to FIG. 31).

In this embodiment, in other words, the clamp step is divided into the following two steps: a first step at which the distance between the upper die 17a and lower die 17b is reduced at the first speed 19a; and a second step at which the distance between the upper die 17a and the lower die 17b is further reduced (a higher load than at the first step is applied to each base material 4) at the second speed 19b lower than the first speed 19a. At the first step, the under surface 18b of the film 18 and the upper surface 12a of each protective sheet 12 are abutted against each other. At the second step, part of each base material 4 is caused to bite into the film 18.

Thus the speed at which the upper die 17a and the lower die 17b are brought close to each other is varied between before and after the under surface 18b and the upper surface 12a are abutted against each other. This makes it possible to suppress degradation in processing speed and prevent damage to the base materials 4 during the clamp operation.

If the speed is abruptly changed from the first speed 19a to the second speed 19b when each base material 4 is caused to bite, a wrinkle may be produced in the film 18. If a wrinkle is produced in the film 18, that will cause malformation of the encapsulation resin. To cope with this in this embodiment, the second speed 19b is reduced as the distance between the upper die 17a and the lower die 17b is reduced. This makes it possible to prevent or suppress the production of a wrinkle in the film 18.

In this embodiment, as illustrated in FIG. 3, the above-mentioned members are sealed so that the under surface 1b of each tab 1 is exposed from the under surface 6b of the sealing body 6. At this step, therefore, the following members are arranged between the upper die 17a and the lower die 17b so that they overlap with one another: the members including the tabs 1, first adhesive 9, semiconductor chips 3, second adhesive 11, base materials 4, and film 18. The following advantage is obtained by arranging the individual members between the upper die 17a and the lower die 17b so that they overlap with one another at the clamp step: each member is fixed and clamp force is prone to be evenly transmitted in the main surface 4a of each base material 4 during the clamp operation. That is, the following takes place in the film 18, or the member softest and most prone to be deformed among the constituent members: it is deformed at the contact interface between it and the protective sheet 12 or the base material 4 and part (part on the second main surface side) of the side surfaces 4c of each base material 4 bites into the film 18.

From the viewpoint of stability during the clamp operation, it is desirable that the upper surface-side plane area of a member arranged beneath should be equal to or larger than the under surface-side plane area of a member arranged above. In this embodiment, as illustrated in FIG. 30, the plane area of each of the protective sheet 12, base material 4, and second adhesive 11 is smallest and the plane area is increased in the order of the semiconductor chip 3, first adhesive 9, and tab 1. Therefore, each member is stably supported on the member arranged thereunder. As a result, force for biting into the film 18 can be substantially evenly dispersed within the main surface 4a of each base material 4 during the clamp operation.

Similarly from the viewpoint of stability during the clamp operation, it is desirable to cause part of each base material 4 to bite into the film 18 in the following state: a state in which the centers of the tab 1, first adhesive 9, semiconductor chip 3, second adhesive 11, and base material 4 are aligned with one another in the direction of thickness. With this alignment, clamp force can be evenly transmitted and part of each base material can be stably caused to bite. Even transmission of clamp force makes it possible to suppress the production of a wrinkle produced in conjunction with deformation in the film 18.

In this embodiment, multiple base materials 4 are caused to bite into the film 18 at a time. Therefore, it is desirable to equalize biting force from one base material 4 to another. This is intended to prevent force from being concentrated on a specific base material 4 to cause excessive or insufficient biting. In this embodiment, as described above in relation to the base material mounting step, it is possible to make equal pressure applied to the respective main surfaces 4a of multiple base materials 4 and thus excessive or insufficient biting can be prevented.

Figure 32:
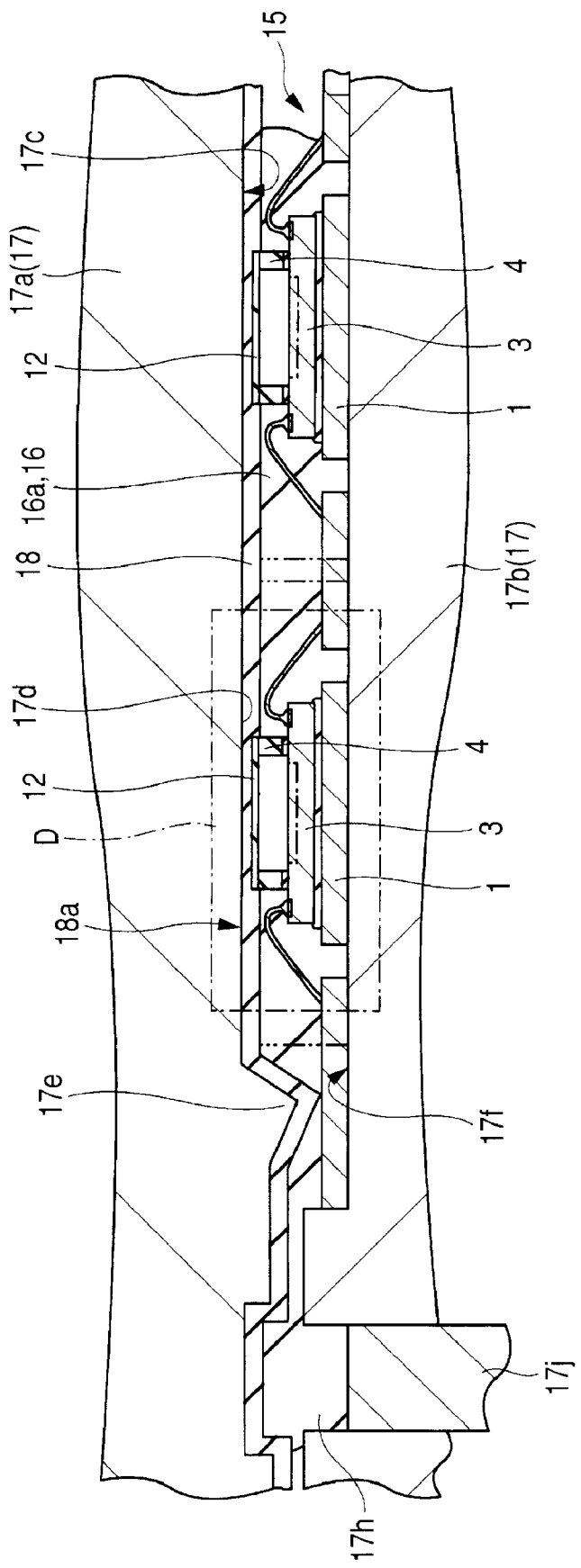
FIG. 32 is a substantial part enlarged sectional view illustrating how sealing resin is supplied to between the film and lower die illustrated in FIG. 29 to form a blanket sealing body.
Figure 33:
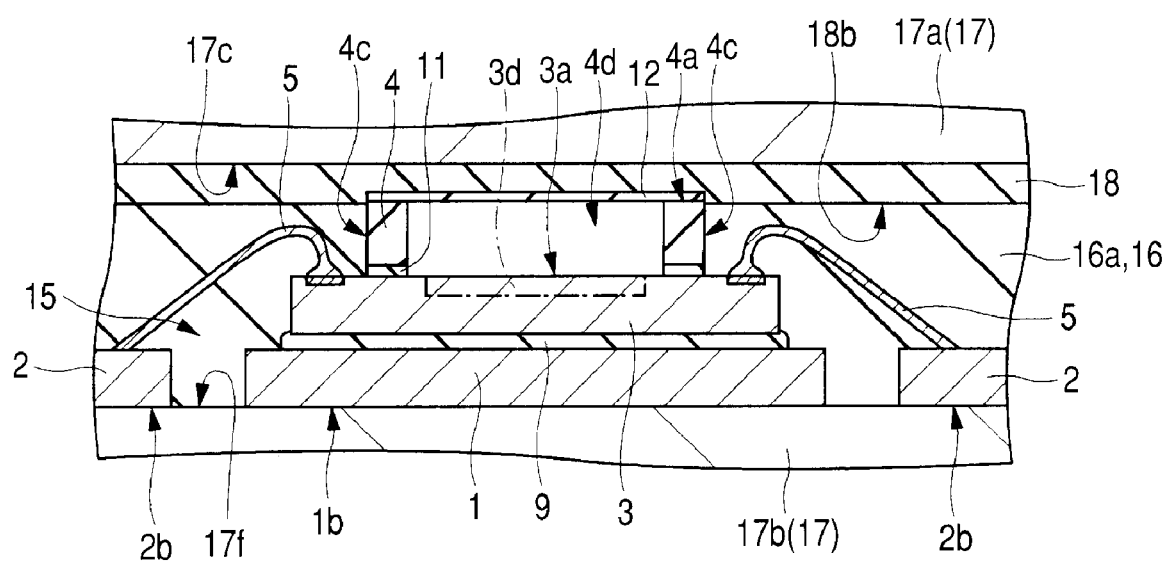
FIG. 33 is a substantial part enlarged sectional view illustrating D part illustrated in FIG. 32 in a further enlarged manner.

As illustrated in FIG. 29, FIG. 32, and FIG. 33, subsequently, sealing resin 16a is supplied to between the film 18 and the lower die 17b to form a blanket sealing body 16 (blanket sealing body formation step). FIG. 32 is a substantial part enlarged sectional view illustrating how sealing resin is supplied to between the film and lower die illustrated in FIG. 29 to form a blanket sealing body; and FIG. 33 is a substantial part enlarged sectional view of further enlarged D part illustrated in FIG. 32.

At this step, the sealing resin 16a illustrated in FIG. 29 is supplied into the cavity 17d and it is thermally cured to obtain the blanket sealing body 16. The sealing resin 16a is tableted as illustrated in FIG. 29 and it is preheated to reduce its viscosity and loaded into the pot portion 17h. By preheating the molding die 17, the viscosity of the resin 16a is further reduced in the pot portion 17h. Subsequently, the resin 16a is pushed out by the plunger 17j and supplied (injected) into the cavity 17d through the gate portion 17e as illustrated in FIG. 32.

The injected resin 16a gradually fills the space in the cavity 17d. The light receiving area 3d of each semiconductor chip 3 is encircled with a base material 4 and the base material 4 is securely bonded over the main surface 3a of the semiconductor chip 3 through the second adhesive 11. At this step, therefore, the light receiving area 3d is encircled with the base material 4 and the protective sheet 12 covering the main surface 4a of the base material 4. For this reason, the sealing resin 16a can be prevented from flowing in and onto the light receiving area 3d.

In this embodiment, as illustrated in FIG. 33, the resin 16a is injected with part of each base material 4 biting into the film 18. For this reason, on the main surface 4a side, there is not formed a gap into which the resin 16a flows. Therefore, the inflow of the resin 16a onto the main surface 4a can be prevented.

In FIG. 33, the under surface 1b of the tab 1 is in contact with the lower die surface 17f of the lower die 17b. Therefore, the above members are so sealed that the under surface 1b of the tab 1 is exposed from the under surface side of the blanket sealing body 16.

The molding die 17 has an air vent portion, not shown, on the opposite side to the gate portion 17e. Therefore, even though air (air bubble) is trapped in the supplied resin 16a, this air (air bubble) does not remain in the cavity 17d and is released to the outside through the air vent portion. For this reason, a problem of void does not arise in the formed blanket sealing body 16.

When the resin 16a is filled and held heated through the molding die 17, the resin 16a is cured and the blanket sealing body 16 is formed.

Subsequently, the upper die 17a and lower die 17b illustrated in FIG. 32 are opened and the lead frame 15 with the blanket sealing body 16 formed thereon is taken out of the molding die 17. Thus the lead frame 15 illustrated in FIG. 24 and FIG. 25 is obtained (mold opening step).

At this step, the distance between the upper die 17a and the lower die 17b is increased to open the mold. If the adhesion strength at the contact interface between the upper die surface 17c and the film 18 is lower than the adhesion strength at the contact interface between the film 18 and the blanket sealing body 16, the following will take place: the film 18 is separated from the upper die surface 17c and sticks to the upper surface side of the blanket sealing body 16 and remains there.

In this case, the lead frame 15 illustrated in FIG. 24 and FIG. 25 is obtained by stripping the film 18 off the upper surface of the blanket sealing body 16. If the resin 16a has flowed to between the film 18 and the upper die surface 17c at this time, the cured resin will also remain on the upper surface 18a side of the film 18. In cases where the cured resin remains on the upper surface 18a side of the film 18, there is concern that at a step of stripping the film 18, the cured resin may drop as a contamination onto the upper surface 12a of a protective sheet 12. If there is a contamination sticking to the upper surface 12a, there is concern that when the protective sheet 12 is stripped off, it may drop onto the light receiving area 3d. Therefore, a step of removing it will be required.

As described in relation to the film arrangement step of arranging the film 18 in the molding die, in this embodiment, the film 18 is so arranged that it covers the upper die surface 17c of the upper die 17a. Therefore, the inflow of the resin 16a to the upper surface 18a side of the film 18 can be prevented and thus the production of a contamination itself can be prevented. For this reason, a step of removing a contamination is unnecessary and this makes it possible to enhance manufacturing efficiency.

Figure 34:
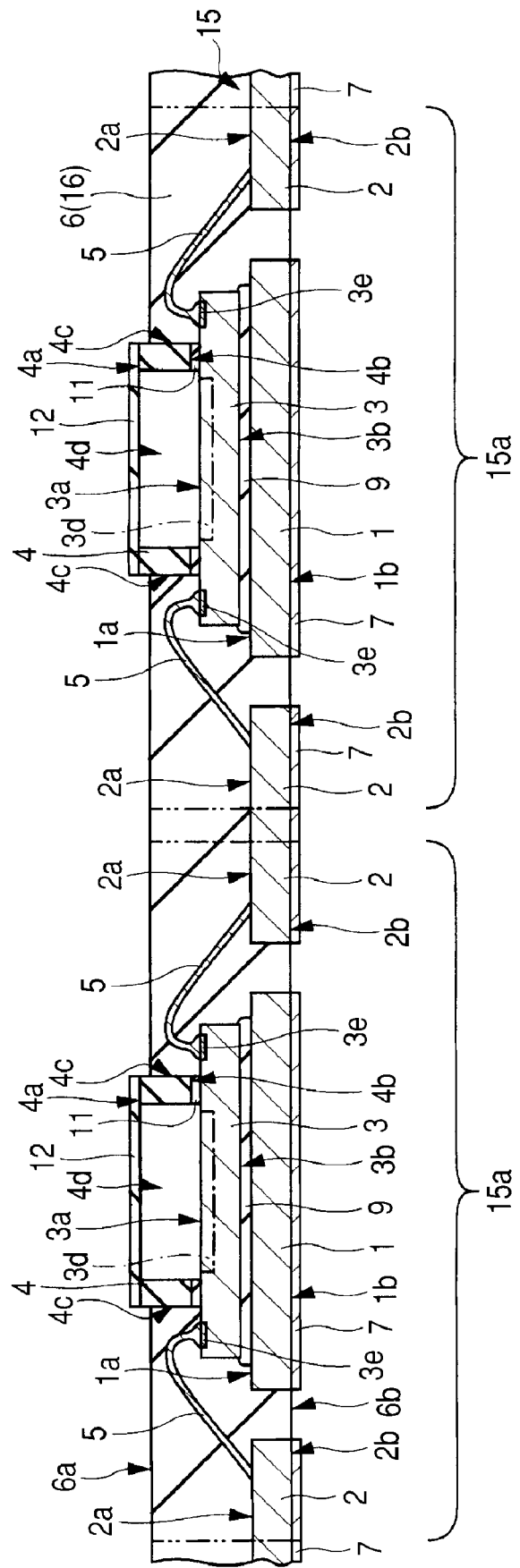
FIG. 34 is an enlarged sectional view illustrating how an external plating layer is formed on the under surfaces of the leads and tabs exposed from the blanket sealing body illustrated in FIG. 25.

As illustrated in FIG. 34, subsequently, an external plating layer (metal layer) 7 is formed on the under surface 2b of each of the leads 2 exposed from the blanket sealing body 16 (external plating formation step). FIG. 34 is an enlarged sectional view illustrating how an external plating layer is formed on the under surfaces of the leads and the tabs exposed from the blanket sealing body illustrated in FIG. 25.

At this step, the external plating layer 7 is formed by, for example, the following procedures: the lead frame 15 with the blanket sealing body 16 formed thereon illustrated in FIG. 25 is immersed in a plating bath, not shown, and with the lead frame 15 submerged in a plating solution, electroplating is carried out to grow the plating layer on the under surface 2b side of each lead 2. In this embodiment, the under surface 1b of each tab 1 is also exposed on the under surface 6b side of the blanket sealing body similarly with the under surface 2b of each lead 2. Therefore, the external plating layer 7 is also formed on the under surface 1b of each tab 1.

Figure 35:
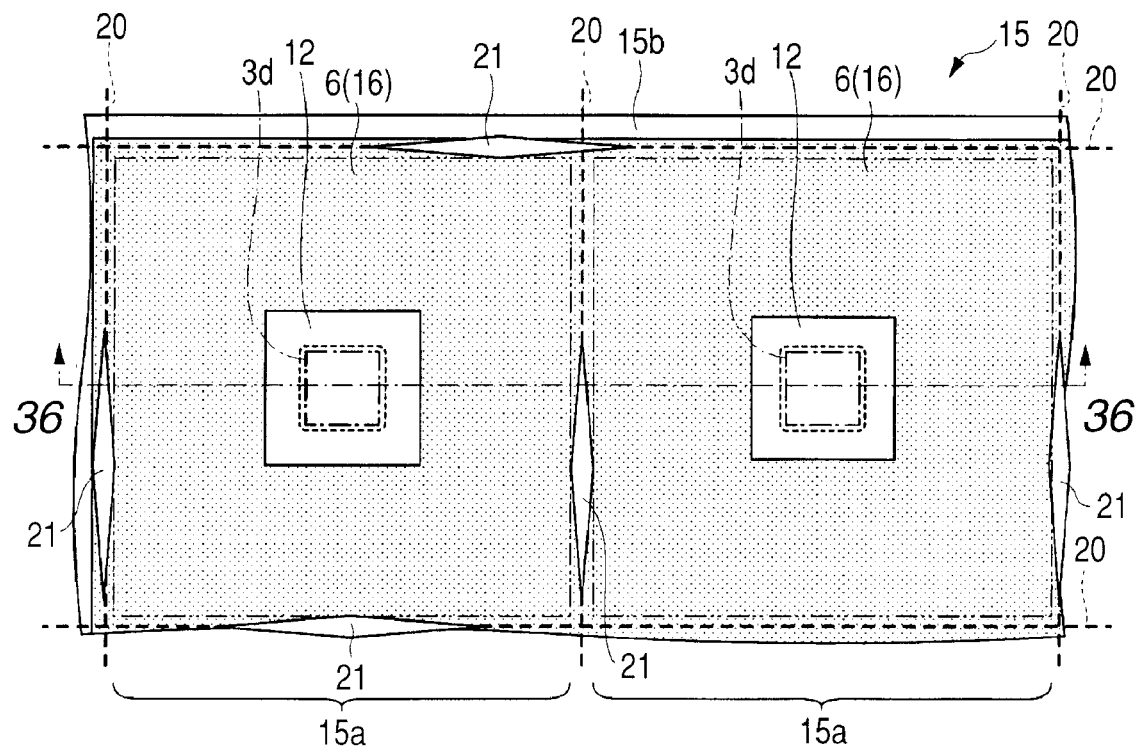
FIG. 35 is an enlarged plan view illustrating cutting lines for cutting the lead frame illustrated in FIG. 34 into individual semiconductor devices.
Figure 36:
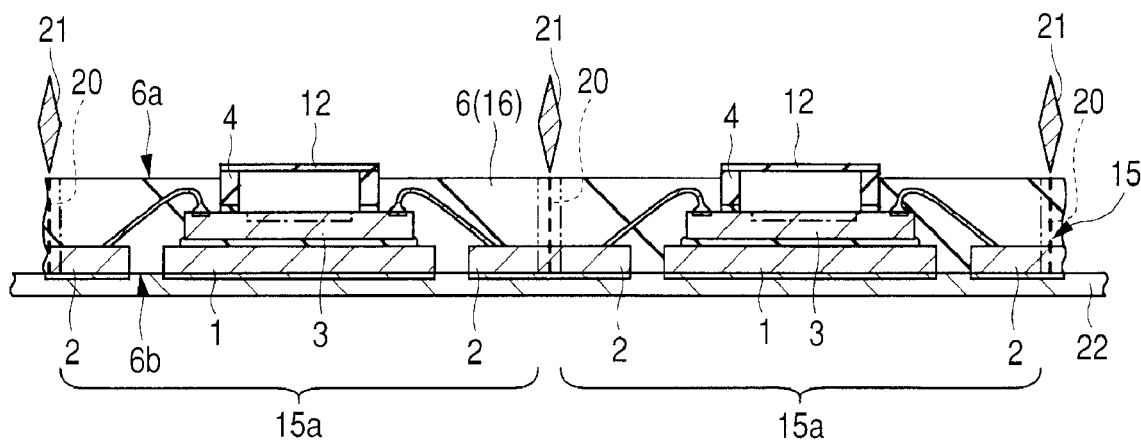
FIG. 36 is an enlarged sectional view taken along line C-C of FIG. 35.
Figure 37:
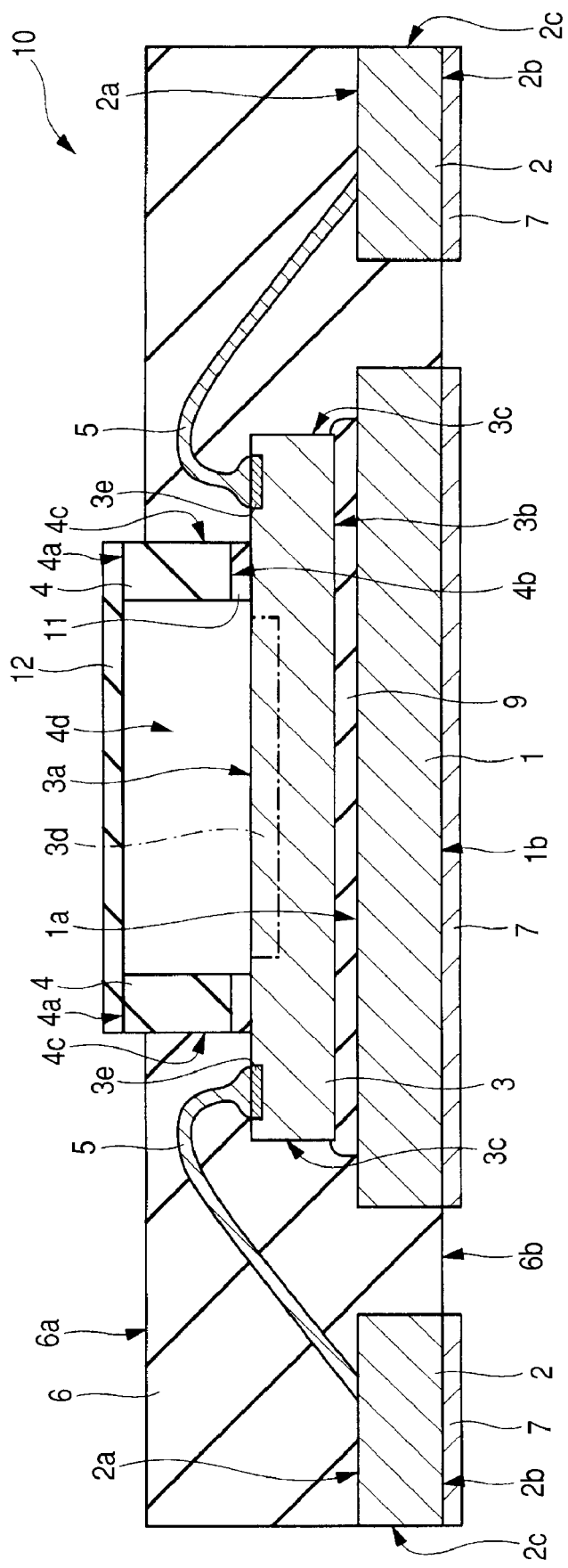
FIG. 37 is a sectional view illustrating a semiconductor device obtained as the result of cutting.

As illustrated in FIG. 35 and FIG. 36, subsequently, the hanging leads and the leads 2 are cut off from the frame bodies 15b (segmentation step). FIG. 35 is an enlarged plan view illustrating cutting lines along which the lead frame illustrated in FIG. 34 is cut into the individual semiconductor devices and FIG. 36 is an enlarged sectional view taken along line C-C of the FIG. 35. FIG. 37 is a sectional view illustrating a cut and segmented semiconductor device.

This step is carried out with the upper surface 6a of the blanket sealing body 16 facing upward as illustrated in FIG. 36, for example. In other words, this step is carried out with the under surface 6b side of the blanket sealing body 16 fixed by a dicing tape 22. A dicing blade 21 is run from the upper surface 6a side of the blanket sealing body 16 to cut it. At this time, the dicing blade 21 is caused to reach not only the blanket sealing body 16 but also part of the dicing tape 22. Thus the lead frame 15 and the blanket sealing body 16 can be completely segmented. The dicing blade 21 is moved along the dicing lines (cutting lines) 20 illustrated in FIG. 35 while it is cutting the lead frame 15 and the blanket sealing body 16.

When this step is completed, the QFN 10 illustrated in FIG. 37 is obtained. Finally, the appearance of each segmented QFN 10 is inspected to check for any stripped external plating layer 7 and any crack produced between the sealing body 6 and the tab 1, leads 2, or base material 4. When any defect is not found, the manufacture of the semiconductor device is completed. In cases where the QFN 10 is used as a photosensor, a step of stripping the protective sheet 12 is required; however, the protective sheet 12 only has to be removed before the QFN 10 is used. Therefore, in cases where the QFN 10 is mounted over a mounting board, not shown, elsewhere, for example, it is desirable to take the following measure: it is transported with the opening 4d in the base material 4 covered with the protective sheet 12 as illustrated in FIG. 37; and after it is mounted over the mounting board, the protective sheet 12 is removed. This is intended to protect the light receiving area 3d against contamination (a fallen contamination and the like).

<Modifications>

Description will be given to modifications to this embodiment.

Figure 38:
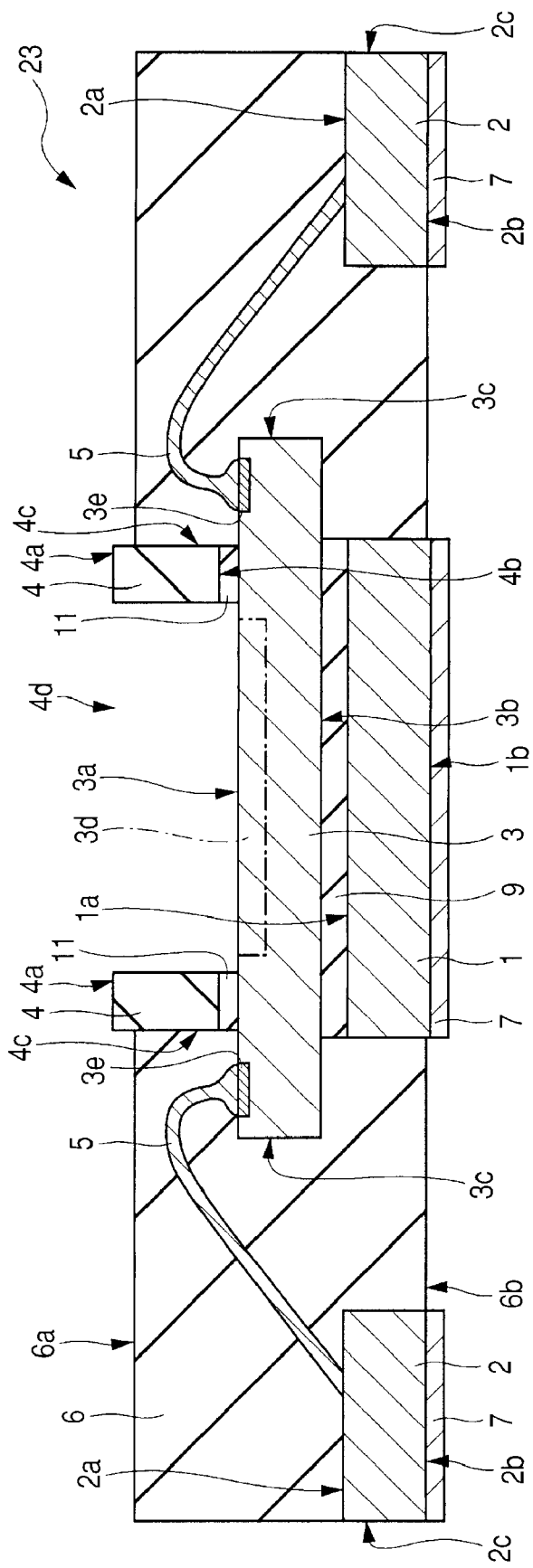
FIG. 38 is a sectional view of a semiconductor device in a first modification to the invention.

FIG. 38 is a sectional view of a semiconductor device in a first modification to the above embodiment. A difference between the QFN 23 illustrated in FIG. 38 and the QFN 10 illustrated in FIG. 3 is the size of their tabs 1. The tab 1 of the QFN 23 is smaller in the area of the upper surface 1a than the tab 1 illustrated in FIG. 3. The area of the upper surface of the QFN 23 is smaller than the area of the back surface 3b of the semiconductor chip 3 mounted over the upper surface 1a.

When the semiconductor chip 3 is mounted over the tab 1 whose area is smaller than the area of the semiconductor chip 3 as mentioned above, the following advantage can be obtained: a common lead frame can also be used when a semiconductor chip 3 different in the area of the back surface 3b is mounted. This is favorable from the viewpoint of the enhancement of manufacturing efficiency.

When a semiconductor device, such as the QFN 10 or 23, is mounted over a mounting board, a joining material, for example, solder is melted at a heating step designated as reflow process and thus it is heated to approximately 260° C.

At this time, a crack designated as reflow crack may be produced in the sealing body 6 due to a difference in linear coefficient of expansion between members comprising the QFN 10, 23. It has been found so far that increasing the area of contact between the semiconductor chip 3 and the sealing body 6 is an effective method for reflow crack prevention. That is, the QFN 23 illustrated in FIG. 38 is favorable from the viewpoint of reliability enhancement as well.

However, the tab 1 is a member that should function as a base for stably transmitting clamp force at the above clamp step. Therefore, if the area of the upper surface 1a of the tab 1 is extremely reduced, the pressure applied to the main surface 4a of the base material 4 cannot be made uniform. The too small area gives a bending moment to the periphery of the chip and increases a risk of chip cracking.

From the viewpoint of making pressure uniform, therefore, it is desirable that the outer dimensions of the upper surface 1a of the tab 1 should be larger than the outer dimensions of the back surface 4b of the base material 4. In FIG. 38, the outer dimensions of the upper surface 1a of the tab 1 is substantially the same as the outer dimensions of the back surface 4b of the base material 4. In this case, it is especially desirable to take the following measure: part of the base material 4 is caused to bite into the film 18 with the centers of the tab 1, first adhesive 9, semiconductor chip 3, second adhesive 11, and base material 4 aligned with one another in the direction of thickness.

Figure 39:
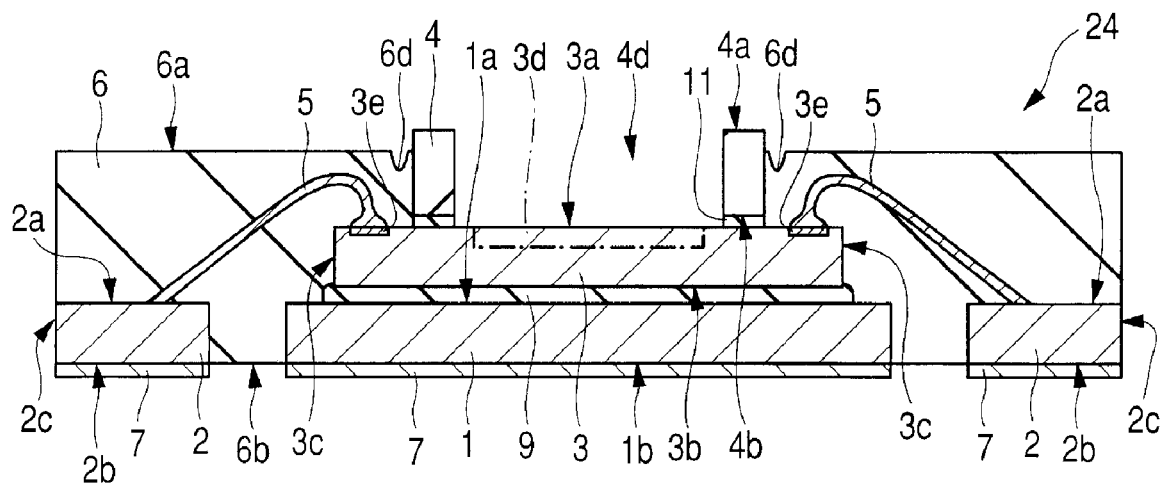
FIG. 39 is a sectional view of a semiconductor device in a second modification to the invention.
Figure 40:
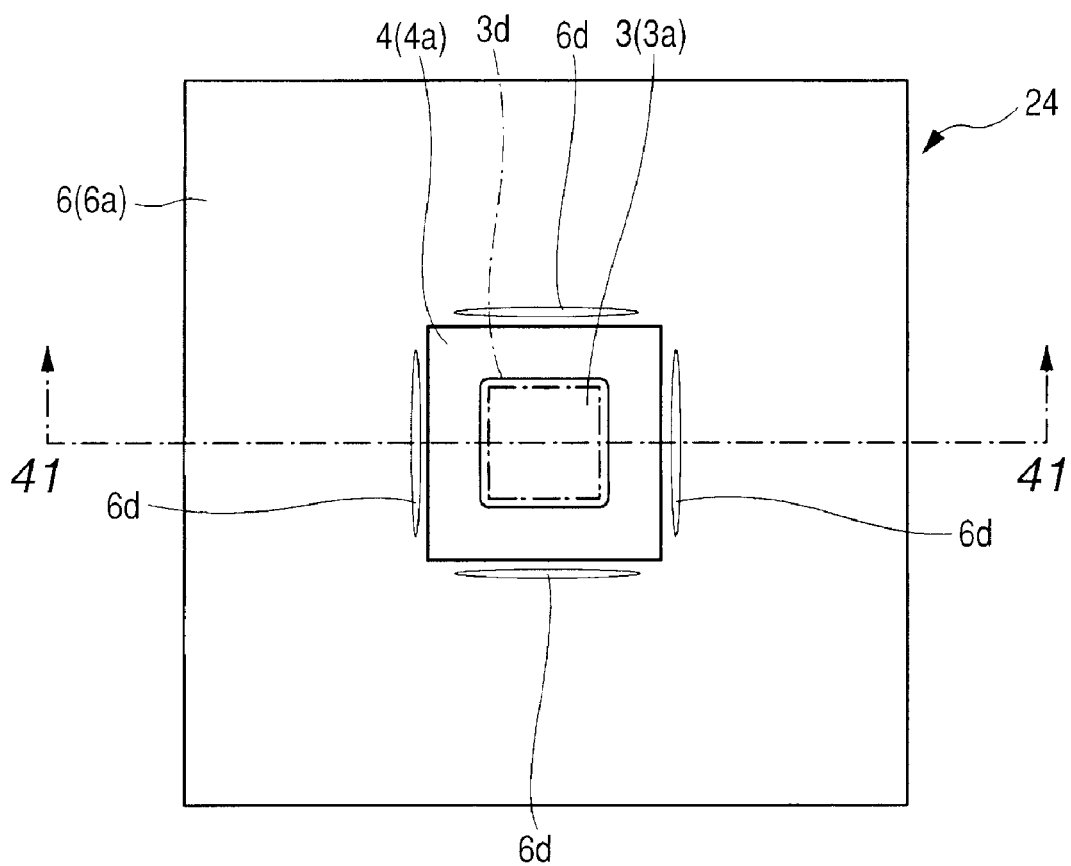
FIG. 40 is a plan view of the upper surface side of the semiconductor device illustrated in FIG. 39.

FIG. 39 is a sectional view of a semiconductor device in a second modification to the above embodiment. FIG. 40 is a plan view of the upper surface side of the QFN illustrated in FIG. 39. The sectional view in FIG. 39 corresponds to a section taken along line A-A of FIG. 40.

A difference between the QFN 24 illustrated in FIG. 39 and FIG. 40 and the QFN 10 illustrated in FIG. 1 to FIG. 4 is in that: the sealing body 6 of the QFN 24 has depressions 6d formed around the base material 4 in the upper surface 6a. These depressions 6d are formed when a large wrinkle is produced on the under surface 18b side while part of each base material 4 is caused to bite into the film 18 at the clamp step.

More specific description will be given. When part of each base material 4 is caused to bite into the film 18 at the clamp step, the area of the film 18 opposed to the main surface 4a is deformed. As a result, the thickness of the area becomes smaller than the thickness of the surrounding area. At this time, in an area opposite the peripheral portion of the main surface 4a, part of the film 18 pressed by the base material 4 is pushed out to the side surface 4c side of the base material 4. As a result, a wrinkle is produced. When resin 16a is thereafter supplied at the blanket sealing body formation step, the resin 16a is filled in accordance with the contour of the under surface 18b of the film 18. If a large wrinkle is produced, therefore, the depressions 6d become larger in correspondence therewith.

When the depressions 6d are small in size, they do not especially contribute to degradation in the reliability of the QFN 24. However, when the depressions 6d become larger and, for example, a wire 5 is exposed from a depression 6d, this leads to degradation in the reliability of the QFN 24. Therefore, it is desirable that the size of the depressions 6d should be reduced as much as possible.

An investigation by the present inventors revealed that the depressions 6d were prone to become larger when the dies were clamped by excessively strong force at the lamp step. Further, it was revealed that the depressions were prone be become larger in the following cases: cases where the speed during the clamp operation, especially, the second speed 19b after the abutment between the film 18 and the protective sheet 12 is too high; and cases where the amount of change when the speed is changed from the first speed 19a to the second speed 19b is too large.

Therefore, it was revealed that the following measure was favorable also from the viewpoint of preventing the production of a large depression 6d as in the manufacturing method for the QFN 10 described with reference to FIG. 1 to FIG. 37: the second speed 19b after the abutment between the film 18 and the base material 4 is made lower than the first speed 19a; and the second speed 19b is reduced as the distance between the upper die 17a and the lower die 17b is reduced.

As described above in relation to the base material mounting step, it is also favorable from the viewpoint of preventing the production of a large depression 6d to make force exerted on the multiple base materials 4 substantially equal.

Figure 41:
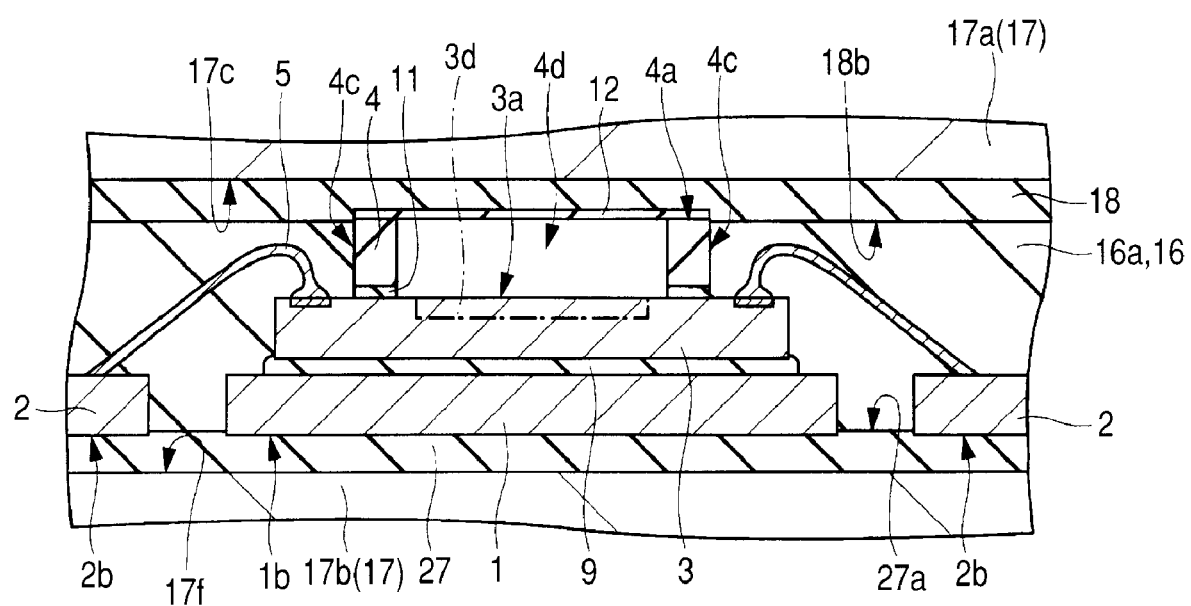
FIG. 41 is an enlarged sectional view explaining a modification to the manufacturing method of the invention.

FIG. 41 is an enlarged sectional view explaining a modification to the manufacturing method in the above embodiment. Though FIG. 41 is an enlarged sectional view explaining a modification to the above sealing step, it representatively shows an enlarged sectional view corresponding to FIG. 33. A semiconductor device obtained using the modification described with reference to FIG. 41 is identical in structure with the QFN 10 illustrated in FIG. 1 to FIG. 4, except that: it makes it possible to more reliably prevent the production of resin flash in the under surfaces 1b, 2b of the tab 1 and leads 2 of the QFN 10 illustrated in FIG. 1 to FIG. 4. Therefore, the semiconductor device will not be shown and description will be given with reference to FIG. 1 to FIG. 4 as required.

A difference between the manufacturing method illustrated in FIG. 41 and the manufacturing method described with reference to FIG. 33 is in that: at the sealing step, a lower die surface coating film (second film) 27 is arranged between the lower die surface 17f of the lower die 17b and the under surface of the lead frame 15.

When the lower die surface coating film 27 covering the lower die surface 17f is brought into tight contact with the lower die surface 17f as illustrated in FIG. 41 and the dies are clamped, the following takes place: part (part on the under surface 1b, 2b side) of the tab 1 and the leads 2 bites into the upper surface 27a of the lower die surface coating film 27. This makes it possible to prevent or suppress the production of resin flash on the under surfaces 1b, 2b, or the back surfaces of the tab 1 and the leads 2. That is, it is possible to prevent or suppress the production of resin flash on an external connecting terminal surface of the QFN 10 (Refer to FIG. 3). Therefore, it possible to prevent problems of peeling and like of the external plating layers 7 illustrated in FIG. 3 due to resin flash. By preventing the production of resin flash, the electrical resistance at the contact interface between a lead 2 and its external plating layer 7 can be reduced. Therefore, the reliability of the QFN 10 can be further enhanced.

As mentioned above, the lower die surface coating film 27 has the following function: a function of preventing or suppressing the production of resin flash on the under surfaces 1b, 2b by causing part of the tab 1 and the leads 2 to bite thereinto at the sealing step. Therefore, it is desirable to use a soft resin material for the lower die surface coating film. For example, the same material as that of the upper die surface coating film (first film) 18 arranged in tight contact with the upper die surface 17c of the upper die 17a can be used for this purpose.

However, from the viewpoint of the reliability of the QFN 10 as a photosensor-type semiconductor device, it is important to prevent the production of resin flash on the main surface 4a side of the base material 4. It is more important than to prevent the production of resin flash on an external connecting terminal surface. For this reason, it is desirable that the hardness of the lower die surface coating film 27 should be equal to or higher than that of the film 18 covering the upper die surface. Further, it is desirable that the thickness of the lower die surface coating film 27 should be equal to or larger than that of the upper die surface coating film 18 as illustrated in FIG. 41. This is intended to deform mainly the upper die surface coating film 18 to reliably cause part of each base material 4 to bite into the upper die surface coating film 18 for the prevention of the production of resin flash on each main surface 4a.

Finally, description will be given to a semiconductor device in a third modification to the above embodiment. In the description of the above embodiment, a case where the frame-like base material 4 is formed of the same material as that of the semiconductor chip 3 has been taken as an example. In the third modification to the above embodiment, any other material can be utilized in consideration of the strength (rigidity) of the member and its coefficient of thermal expansion relative to the semiconductor chip or the encapsulation resin. In the third modification, the base material may be formed of, for example, sheet metal, sheet resin, or the like by press. Or, a frame-like molded part can also be obtained by molding a metal material or a resin material.

Up to this point, concrete description has been given to the invention made by the present inventors based on an embodiment. However, the invention is not limited to the above embodiment and can be variously modified without departing from its subject matter, needless to add.

Some examples will be taken. In the description of the above embodiment, MAP has been taken as an example of manufacturing methods for semiconductor devices. However, the manufacturing process for semiconductor devices is not limited to this and the invention can be applied to, for example, the following method (designated as multi-piece molding): a method in which sealing is carried out using a mold having multiple cavities in correspondence with the number of the product formation regions 15a in a lead frame 15.

In the above description, an embodiment in which the invention is applied to a QFN package has been taken as an example of a photosensor-type semiconductor device. However, the application of the invention is not limited to QFN packages and the invention is also applicable to, for example, SONs (Small Outline Non-leaded packages). In SONs, multiple leads are arranged on only two opposite sides of the four sides of the rectangular under surface of a semiconductor device.

From the viewpoint of reduction of the cost of semiconductor devices, the invention is especially favorably applicable to packages, such as QFNs and SONs, of such a type that a semiconductor chip is mounted over a lead frame. In consideration of coping with increase in the number of pads in a semiconductor chip, packages in which a semiconductor chip is mounted over a wiring substrate are desirable. Examples of such packages include LGA (Land Grid Arrays) and the BGA (Ball Grid Allay) 34 illustrated in FIG. 42 and FIG. 43. Hereafter, brief description will be given to an embodiment in which a semiconductor chip is mounted over a wiring substrate.

Figure 42:
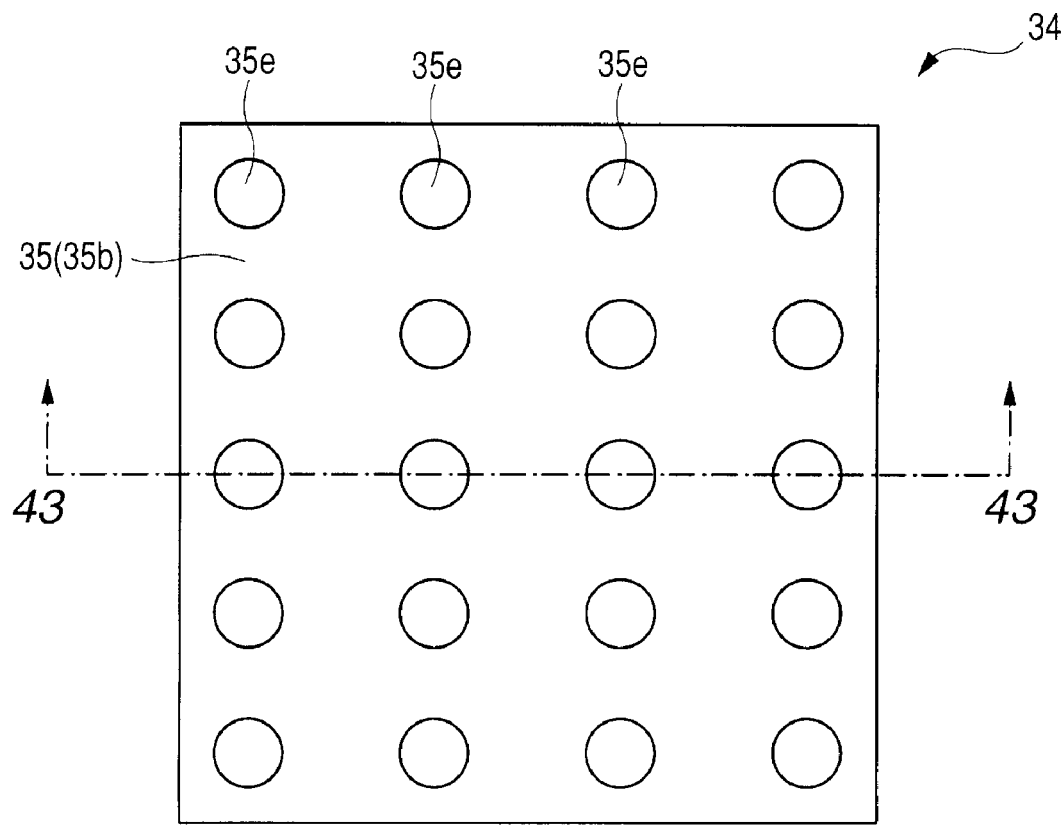
FIG. 42 is a plan view illustrating the upper surface side of a semiconductor device in another embodiment of the invention.
Figure 43:
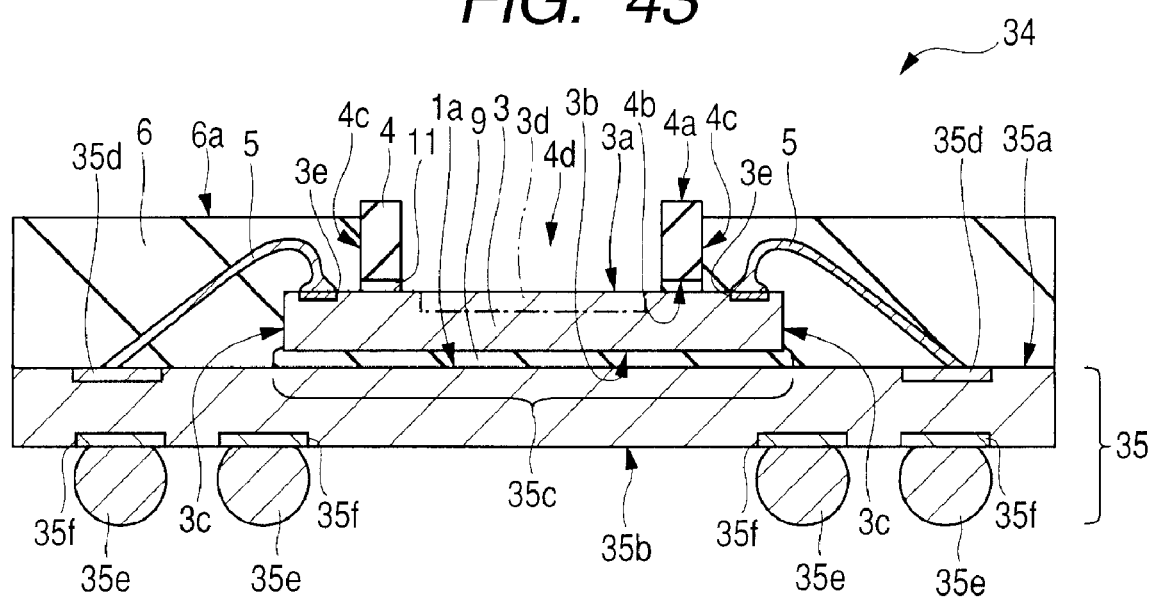
FIG. 43 is a sectional view taken along line E-E of FIG. 42.

FIG. 42 is a plan view illustrating the under surface side of a semiconductor device in another embodiment and FIG. 43 is a sectional view taken along line E-E of FIG. 42.

A difference between the BGA 34 illustrated in FIG. 42 and the QFNs 10, 23, 24 described in relation to the above embodiment is in that: a semiconductor chip 3 is mounted over a wiring substrate (substrate) 35 as a base material.

The wiring substrate 35 includes: an upper surface 35a; an under surface 35b on the opposite side to the upper surface 35a; a chip mounting area 35c formed in the upper surface 35a; multiple bonding leads (electrode areas) 35d arranged around the chip mounting area 35c in the upper surface 35a; and multiple bump electrodes (external terminals) 35e arranged in the under surface 35b and respectively electrically coupled with land areas 35f.

The pads 3e formed in the main surface 3a of the semiconductor chip 3 are respectively electrically coupled with the bonding leads 35d through wires 5. The bonding leads 35d are electrically coupled to the bump electrodes 35e through electrically conducting paths (not shown) in the wiring substrate 35.

The bump electrodes 35e are arranged in a matrix pattern in the under surface 35b of the wiring substrate 35 as illustrated in FIG. 42. This arrangement of bump electrodes 35e is designated as area array, which makes it possible to make effective use of a space in the under surface 35b of the wiring substrate 35 and thus reduce the size of the semiconductor device.

The material of the bump electrodes 35e is, for example, so-called lead-free solder containing substantially no Pb (lead) similarly with the external plating layer 7 described in relation to the above embodiment. Examples of such a material include only Sn (tin), Sn (tin)-Bi (bismuth), Sn (tin)-Ag (silver)-Cu (copper), and the like.

Also in a semiconductor package, such as BGA 34, using a wiring substrate 35, pads 3e and bonding leads 35d may be coupled with each other through wires 5 from the viewpoint of cost reduction. In this case, it is required to seal the upper surface 35a side of the wiring substrate 35 with a sealing body 6 for protecting the wires 5.

The BGA 34 is a photosensor semiconductor device like the QFNs 10, 23, 24. In the area above the light receiving area 3d, therefore, it is required to ensure a passage through which projected light passes. For this reason, the production of resin flash can be prevented by exposing part of the side surfaces 4c of the base material 4 as described in relation to the above embodiment. This makes it possible to enhance reliability.

The various modifications and the like described in relation to the above embodiment can be applied to the BGA 34, needless to add.

Brief description will be given only to a difference between the manufacturing method for the BGA 34 and the manufacturing methods for the QFNs 10, 23, 24.

First, the lead frame preparation step described in relation to the above embodiment differs. In the manufacturing method for the BGA 34, first, the following wiring substrate (first base material) 35 is prepared at a wiring substrate preparation step: a wiring substrate that includes: an upper surface 35a; an under surface 35b on the opposite side to the upper surface 35a; a chip mounting area 35c formed in the upper surface 35a; multiple bonding leads (electrode areas) 35d arranged around the chip mounting area 35c in the upper surface 35a; and multiple land areas 35f arranged in the under surface 35b and respectively electrically coupled with the bonding leads 35d. The wiring substrate prepared at this step is a multi-device wiring substrate having multiple product formation regions each corresponding to one semiconductor device (BGA 34). At this step, the bump electrodes 35e have not been formed yet in the under surface 35b of the wiring substrate.

At a die bonding step, a semiconductor chip 3 is mounted over the chip mounting area 35c in each product formation region of the wiring substrate through first adhesive 9. The base material mounting step in this embodiment is the same as in the above embodiment and the description thereof will be omitted.

At a wire bonding step, the pads 3e and the bonding leads 35d are respectively electrically coupled with each other through wires (conductive members) 5.

The wiring substrate is a substantially flat plate-like member as illustrated in FIG. 43. The area of its upper surface 35a is larger than that of the back surface 3b of the semiconductor chip 3. At a sealing step (in particular a clamp step), therefore, part of each base material 4 can be stably caused to bite into the film 18.

The external plating formation step described in relation to the above embodiment differs in this embodiment. In the manufacturing method for the BGA 34, a bump electrode formation step is carried out in place of the external plating formation step. At this step, multiple bump electrodes 35e to be external terminals are formed on the under surface 35b side of the wiring substrate taken out of the molding die. The bump electrodes 35e are respectively joined to the land areas 35f formed in the under surface 35b of the wiring substrate.

At a dicing step, dicing is carried out with the surface with the bump electrodes 35e formed therein facing upward. (That is, dicing is carried out with the upper surface of the blanket sealing body stuck to a dicing tape.)

The invention is especially applicable to a photosensor-type semiconductor device having a semiconductor chip with a photosensor formed in its main surface.

What is claimed is:

1. A manufacturing method for semiconductor devices, comprising the steps of:
   (a) preparing a first base material having a chip mounting area and a plurality of electrode areas arranged around the chip mounting area;
   (b) mounting a semiconductor chip having a first main surface, a sensor area formed on the first main surface, a plurality of pads formed on the first main surface and electrically coupled with the sensor area, a first back surface opposed to the first main surface, and first side surfaces positioned between the first main surface and the first back surface over the chip mounting area through a first adhesive such that the first back surface is opposed to the chip mounting area;
   (c) mounting a second base material having a second main surface, a second back surface opposed to the second main surface, second side surfaces positioned between the second main surface and the second back surface, and an opening extended from the second main surface to the second back surface, the opening being covered with a protective sheet stuck over the second main surface, over the first main surface of the semiconductor chip through a second adhesive such that the second back surface is opposed to the first main surface of the semiconductor chip;
   (d) respectively electrically coupling the pads of the semiconductor chip and the electrode areas through a plurality of conductive members; and
   (e) sealing the semiconductor chip, the second base material, and the conductive members with a resin such that part of the second side surfaces of the second base material and the second main surface of the second base material are exposed, and forming a sealing body,
   wherein the sealing body is formed by the steps of:
   (e1) preparing a molding die having an upper die and a lower die opposed to the upper die;
   (e2) arranging a film between the upper die and the lower die;
   (e3) arranging the first base material on which the semiconductor chip and the second base material are mounted between the film and the lower die;
   (e4) after the step (e3), clamping the upper die and the lower die, and biting a part of the second base material into the film;
   (e5) after the step (e4), supplying the resin between the film and the lower die, and forming the sealing body; and
   (e6) after the step (e5), opening the upper die and the lower die, and taking the first base material with the sealing body formed thereon out of the molding die.

2. The manufacturing method for semiconductor devices according to claim 1,
   wherein the whole of the sensor area is arranged inside the opening in the first main surface of the semiconductor chip.

3. The manufacturing method for semiconductor devices according to claim 2,
   wherein the second base material is comprised of the same semiconductor material as the material forming the semiconductor chip.

4. The manufacturing method for semiconductor devices according to claim 2,
   wherein the second adhesive is arranged outside the outer edge of the sensor area in the first main surface of the semiconductor chip.

5. The manufacturing method for semiconductor devices according to claim 1,
   wherein the first base material is a lead frame including: the chip mounting area; a plurality of hanging leads supporting the chip mounting area; a plurality of leads as the electrode areas arranged around the chip mounting area; and a frame body formed integrally with the hanging leads and the leads, and
   wherein the under surface of the chip mounting area is exposed on the under surface side of the sealing body.

6. The manufacturing method for semiconductor devices according to claim 5,
   wherein at the step (e4), part of the second base material is caused to bite into the film with the respective centers of the chip mounting area, the first adhesive, the semiconductor chip, the second adhesive, and the second base material aligned with one another in the direction of thickness.

7. The manufacturing method for semiconductor devices according to claim 1,
   wherein the step (e4) includes the steps of:
   (e4a) reducing the distance between the upper die and the lower die at a first speed to abut the under surface of the film and the upper surface of the protective sheet against each other; and
   (e4b) after the step (e4a), reducing the distance between the upper die and the lower die at a second speed lower than the first speed to cause part of the second base material to bite into the film.

8. The manufacturing method for semiconductor devices according to claim 7,
   wherein the second speed is reduced as the distance between the upper die and the lower die is reduced.

9. The manufacturing method for semiconductor devices according to claim 1,
   wherein the area of the upper surface of the chip mounting area is larger than the area of the first back surface of the semiconductor chip.

10. The manufacturing method for semiconductor devices according to claim 1,
wherein the thickness of the second adhesive is smaller than the thickness of the first adhesive.

11. The manufacturing method for semiconductor devices according to claim 1,
wherein at the step (c), the semiconductor chip is so mounted that the height of the second main surface of the second base material mounted over the first main surface of the semiconductor chip is higher than the height of the top of each of the conductive members respectively electrically coupling the pads and the electrode areas with each other at the step (d).

* * * * *